United States Patent
Shinotsuka

(10) Patent No.: US 8,202,582 B2
(45) Date of Patent: Jun. 19, 2012

(54) SINGLE PARTICLE FILM ETCHING MASK AND PRODUCTION METHOD OF SINGLE PARTICLE FILM ETCHING MASK, PRODUCTION METHOD OF MICRO STRUCTURE WITH USE OF SINGLE PARTICLE FILM ETCHING MASK AND MICRO STRUCTURE PRODUCED BY MICRO STRUCTURE PRODUCTION METHOD

(75) Inventor: Kei Shinotsuka, Tokyo (JP)

(73) Assignee: Oji Paper Co., Ltd., Tokyo (JP)

( * ) Notice: Subject to any disclaimer, the term of this patent is extended or adjusted under 35 U.S.C. 154(b) by 352 days.

(21) Appl. No.: 12/306,476

(22) PCT Filed: Jun. 21, 2007

(86) PCT No.: PCT/JP2007/062490
§ 371 (c)(1),
(2), (4) Date: Dec. 23, 2008

(87) PCT Pub. No.: WO2008/001670
PCT Pub. Date: Jan. 3, 2008

(65) Prior Publication Data
US 2009/0274873 A1    Nov. 5, 2009

(30) Foreign Application Priority Data
Jun. 30, 2006    (JP) .................................. 2006-181274

(51) Int. Cl.
*B01J 19/08* (2006.01)
*G21H 1/00* (2006.01)
(52) U.S. Cl. ......... 427/457; 427/487; 427/600; 427/601
(58) Field of Classification Search ............... 216/42, 216/41, 56, 58; 438/156, 689, 694, 706; 428/143, 156; 427/372.2; 977/700
See application file for complete search history.

(56) References Cited

U.S. PATENT DOCUMENTS
4,407,695 A    10/1983    Deckman et al.
(Continued)

FOREIGN PATENT DOCUMENTS
JP    58-120255    7/1983
(Continued)

OTHER PUBLICATIONS
Kuo, Chun-Wen et al., "Fabrication of Size-Tunable Large-Area Periodic Silicon Nanopillar Arrays with Sub-10-nm Resolution," Journal of Physical Chemistry, vol. 107, pp. 9950-9953, 2003.
(Continued)

*Primary Examiner* — Duy Deo
(74) *Attorney, Agent, or Firm* — K&L Gates LLP

(57) ABSTRACT

A micro structure which is preferred as an original plate of an antireflection, a mold of nano imprint or injection molding is obtained by a single particle film etching mask on which each particle is precisely aligned and closest packed in two dimensions. A single particle film etching mask is produced by a drip step wherein a dispersed liquid in which particles dispersed in a solvent are dripped onto a liquid surface of a water tank, a single particle film formation step in which a single particle film which consists of the particles by volatizing a solvent is formed, and a transfer step in which the single particle film is transferred to a substrate. The single particle film etching mask on which particles are closest packed in two dimensions, has a misalignment D(%) of an array of the particles that is defined by D(%)=|B−A|×100/A being less than or equal to 10%. However, A is the average diameter of the particles, and B is the average pitch between the particles in the single particle film.

2 Claims, 10 Drawing Sheets

U.S. PATENT DOCUMENTS

2001/0000330 A1* 4/2001 Strodtbeck .................... 427/601
2005/0266271 A1* 12/2005 Tsuchiya et al. .............. 428/810

FOREIGN PATENT DOCUMENTS

| | | |
|---|---|---|
| JP | 2005-279807 | 10/2005 |
| JP | 2007-500606 | 1/2007 |
| WO | 2005/059952 | 6/2005 |

OTHER PUBLICATIONS

Denkov, N. D. et al., "Two-dimensional crystallization," Nature, vol. 361, p. 26, 1993.

Van Duffel, B. et al., "Langmuir-Blodgett deposition and optical diffraction of two-dimensional opal," Journal of Materials Chemistry, vol. 11, pp. 3333-3336, 2001.

Szekeres, M. et al., "Ordering and optical properties of monolayers and multilayers of silica spheres deposited by the Langmuir-Blodgett method," Journal of Materials Chemistry, vol. 12, pp. 3268-3274, 2002.

* cited by examiner

SINGLE PARTICLE FILM ETCHING MASK AND PRODUCTION METHOD OF SINGLE PARTICLE FILM ETCHING MASK, PRODUCTION METHOD OF MICRO STRUCTURE WITH USE OF SINGLE PARTICLE FILM ETCHING MASK AND MICRO STRUCTURE PRODUCED BY MICRO STRUCTURE PRODUCTION METHOD

TECHNICAL FIELD

The present invention relates to a single particle film etching mask which is preferably used for production of a micro structure (an antireflection, an original plate of mold for a nano imprint) and its production method, a micro structure which is obtained by the production method and a production method of a micro structure with use of the single particle film etching mask. Furthermore, the present invention relates to a mold for a nano imprint, a nano imprint device, a nano imprint product produced by the device, and a mold for injection molding, an injection molding device, and an injection molded product produced by the device.

The present application claims priority on Japanese Patent Application No. 2006-181274, filed Jun. 30, 2006, the content of which is incorporated herein by reference.

BACKGROUND ART

Antireflections, such as anti-reflection films, tend to be installed on surfaces, for example, PC displays, display windows, display frames, and a variety of displays windows for visibility improvement. In the field of display units in particular, various FPDs (flat panel displays) such as Liquid Crystal Displays (LCDs), plasma displays, rear projectors, FEDs (field emission displays), and OLEDs (organic electro luminescences) have appeared rather than conventional curve surface displays such as CRTs (Braun tube) displays. Displays vary from small size displays such as cellular phones and digital cameras to large screen displays such as large size televisions, and anti-reflection films used by these products are actively examined and manufactured.

In addition, techniques conduct antireflection directly to optical lenses for industrial optical devices, analytical optical devices, components for displays, cameras, microscopes, telescopes, and glasses have been used conventionally. Improvement of optical performance has been achieved by increasing the quantity of uptake light for field lenses and by increasing visibility (antireflection) by modifying eye lenses, or by modifying groups of lenses or inner lenses.

For production methods of antireflection films, a dry method (a vacuum file formation method) called AR (Anti Reflection) and a wet method (a wet film formation method) called LR (Low Reflection) are known conventionally. In addition, a conventional dry method (a vacuum film formation method) has been used to produce an antireflection to non planar lenses.

A dry method is mainly a method to apply metal or metallic oxide to the surface of an object using evaporation and sputtering.

This method enables to produce very high antireflection effect which produces precise film thickness. However, the method has defects such as low productivity and remarkably high cost. Wet method is a method to obtain an antireflective effect with use of formed coating layer on a surface. A wet method enables improvement of bulk production at a low cost by technical progress, and precision in film thickness has been improved along with the technical progress. There are problems with the technique including the difficulty of achieving a coating of precise submicron thickness, the limitation of solvents for coating, the difficulty of securing an adherent of a coating layer and an object, even though the technique has been used on many occasions.

On the other hand, an antireflection film which obtains an antireflection effect by principles completely different from the dry method and the wet method is examined by forming highly precisely arranged micro embosses patterns that is formed with conically-shaped micro projections on a surface.

In particular, by lowering a pitch of the recurrently arranged conically-shaped micro projections below the wavelength of visible light, the refractive index successively varies in the depth direction of the surface (refraction index inclined effect) in the part where conically-shaped micro projections were formed. As result, Fresnel reflection of incident light which is going to incident from the side of the conically-shaped micro projection is suppressed.

There is a method to etch a substrate surface by displacing a single particle film having particles such as resin, metal on a substrate as an etching mask as one of the micro embosses formation method. According to the method, single particle film would be etched and finally scraped off by itself even though the single particle film acts as an etching mask. As a result, a substrate on which a conically-shaped micro projection is formed in a location corresponding to each particle can be obtained.

For a formation method of such single particle film etching mask, a substrate is dipped in a suspension of colloidal particles. After that, a method to provide an etching mask including a single particle film on a substrate by removing particle layers of a second layer and higher (particle adsorption step) except the first particle layer which bonded to the substrate electrostatically is disclosed in the patent document 1. In addition, a method to transcribe the single particle to the substrate after a single particle film (particle layer) is formed in a sheet substrate is disclosed in the patent document 2. As a method to form a single particle film on a sheet substrate, a binder layer is formed on a sheet substrate, and coat particulate dispersed fluid on top of the binder layer. After that, the binder layer is heated to make the layer soft so that only particle layer of the first layer can be embedded in the binder layer, and extra particles can be washed off.

[Patent document 1] Japanese Laid-Open Patent Application No. Sho 58-120255
[Patent document 2] Japanese Laid-Open Patent Application No. 2005-279807

DISCLOSURE OF INVENTION

Problems to be Solved by the Invention

However, it is difficult to obtain a single particle film etching mask on which each particle is precisely aligned and closest packed in two dimensions, because particles forming a single particle film tends to agglutinate cluster partially to form multiple layers such as more than two layers; and a defect layer which particles do not exits tends to be formed in the methods of the patent document 1 and the patent document 2. As discussed previously, a production of an antireflection film showing enough antireflection effect is recalcitrant since micro embosses pattern which conically-shaped micro projections arranged highly precise would not be formed when poorly arranged single particle film is used as a etching mask so that conically-shaped micro projection is formed at the position of each particle according to the method of using a single particle film as a etching mask.

The present invention is made in view of the above circumstances concerning a single particle film etching mask on which each particle is precisely aligned and closest packed in two dimensions, a single particle film etching mask production method which produces the single particle film etching mask, a micro structure production method which uses the single particle film produced by the single particle film production method, and a highly precise micro structure obtained by the micro structure production method can be provided. In addition, a nano imprint mold or a mold for injection molding with use of a micro structure; a nano imprint device or a injection molding device having the nano imprint mold or the mold for injection molding; a highly precise nano imprint product or a injection molding product obtained by the device are provided.

Means for Solving the Problem

As a result of the inventors determined research, the inventors completed the invention and found the following; a dispersed fluid which particles dispersed in a solvent is dripped in a liquid surface in a water tank, and the solvent is volatized to make a single particle layer of precisely closest packed in two dimensional. In addition, transcribing the single particle layer to a substrate forms highly precisely aligned micro embosses patterns that are formed with conically-shaped micro projections on the surface. Then, a highly precise single particle film etching mask is produced.

A production method of a single particle film etching mask of the present invention includes a drip step which a dispersion liquid which particles are dispersed in a solvent is dripped to a liquid surface of a water tank; a single particle film formation step which forms a single particle film including the particle obtained by volatizing the solvent; a transfer step which transfers the single particle film to a substrate; and an etching step which etches the substrate with gas phase etching and using the single particle film as an etching mask.

When a micro structure of the present invention is an antireflective, the micro structure formation is characterized by being produced by the previously described method, the conically-shaped micro projection is more than or equal to 50 nm, and the aspect ratio of the micro projection of the height to the diameter of the bottom circle is more than or equal to 0.5 of at least one side of the substrate. Then, a micro structure is preferred as an original plate to produce an antireflection, a nano imprint mold or a mold for mold injection. In addition, when a micro structure of the present invention is not an antireflective, the micro structure is characterized by being produced by the previously described method, having cone shape, pillar shape, hemispheric or these shapes on one side of the substrate. Also, when a micro structure of the present invention is not used as an antireflective, the micro structure of the present invention is preferably used as an original plate to produce super water repellent structure, super hydrophilic structure, micro polished surface structure, anti biological adherence structure, antifouling surface structure, MEMS separator structure, and nano imprint or mold for injection molding of these structure.

A production method of a nano imprint mold or a mold for injection molding according to the present invention is characterized by having a transcription step of the micro projection of the micro structure to a metal layer.

The transcription step is preferably a step to remove the metal layer after the metal layer is formed on the surface of the micro projection of the micro structure.

A nano imprint mold or a mold for injection molding of the present invention is characterized by having been produced in the previously mentioned production methods.

A nano imprint device or a mold for injection molding device according to the present invention is characterized by having the nano imprint mold or the mold for injection molding.

A nano imprint product or a mold for an injection molding product of the present invention is characterized by having been produced with the nano imprint device or the mold for an injection molding device.

The single particle film etching mask of the present invention is characterized by the etching mask having the single particle film on which each particle is precisely aligned and closest packed in two dimensions. A misalignment D(%) of an array of the particle which is defined in the following equation (1) is less than or equal to 10%.

$$D(\%)=|B-A|\times 100/A \tag{1}$$

(In the equation (1), A is the average diameter of the particle, B is the average pitch between particles in the single particle film)

A micro structure of the present invention is characterized by a micro structure producing a gas phase etching with the use of the single particle film etching mask. A misalignment D'(%) of an array of the structure which is defined in the following equation (2) is less than or equal to 10%.

$$D'(\%)=|C-A|\times 100/A \tag{2}$$

(In the equation (2), A is the average diameter of the particle, C is the average pitch of the structural array in the microstructure)

A nano imprint mold or a mold for injection molding of the present invention is characterized by a nano imprint mold or mold for injection molding produced by electroforming with use of the micro structure. A misalignment D"(%) of an array of the structure which is defined in the following equation (3) is less than or equal to 10%.

$$D''(\%)=|E-A|\times 100/A \tag{3}$$

(In the equation 3, A is the average diameter of the particle, E is the average pitch of the structural array in the nano imprint mold or the mold for injection molding)

A nano imprint product or injection molding product of the present invention is produced by a nano imprint method or an injection molding method with the use of the nano imprint mold or the mold for injection molding. A misalignment D'''(%) of an array of the structure which is defined in the following equation (4) is less than or equal to 10%.

$$D'''(\%)=|F-A|\times 100/A \tag{4}$$

(In the equation 4, A is the average diameter of the particle, F is the average pitch of the structural array in the nano imprint or injection molding)

Effect of the Invention

According to the present invention, the single particle film etching mask having a single particle film which particles are closest packed in two dimensions and the production method; production method of a micro structure with use the single particle film etching mask and the highly precised micro structure produced by the production method are provided. Besides a nano imprint mold which uses a micro structure, a nano imprint device which has the mold for nano imprint, and a highly precise nano imprint product obtained by the device, are provided.

REFERENCE NUMERALS

Figure 1:
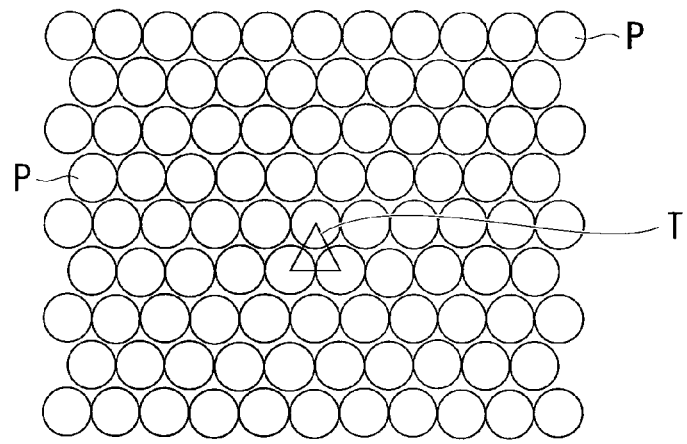
FIG. 1 is a plane view shows a single particle film etching mask in a simple form.

P: Particle
F: Single particle film
C: Micro structure
11: Substrate

BEST MODE FOR CARRYING OUT THE INVENTION

The present invention is explained in detail as follows.

[Single Particle Film Etching Mask]

A single particle film etching mask of the present invention is an etching mask having a single particle film including large amount of particles P is closest packed in two dimensions. A misalignment D(%) of an array of the particles which is defined in the following equation (1) is less than or equal to 10%.

$$D[\%]=|B-A|\times 100/A \quad (1)$$

In the equation 1, A is the average diameter of particles P having a single particle film, and B is the average pitch of particles in a single particle film. In addition, |B−A| shows the absolute value of the difference between A and B.

The average particle diameter A is the average primary particle diameters of the particles that have a single particle film. The average particle diameter A can be conventionally obtained from a peak which is obtained from Gaussian curve fitted representing particle size distribution based on a particle dynamic light scattering method.

On the other hand, the pitch between particles is the distance between the top-most vertices of two neighboring particles and the average pitch B is the average of these neighboring particles. In addition, if a particle has a spherical shape, the distance between the top-most vertices of two neighboring particles is equal to the distance between the centers of the neighboring particles.

The average pitch B between particles in a single particle film etching mask is specifically obtained as follow.

At first, an atomic force microscope image or a scanning electron microscope image of a randomly selected area of a single particle film etching mask with a square area of 30-40 wavelengths per side of micro structural.

For example, an image with an area from 9 μm×9 μm to 12 μm×12 μm in the case of a single particle film with a particle diameter of 300 nm is obtained. Then, this image is treated with a waveform separation by Fourier transformation, and an FFT image (a fast Fourier transformation image) is obtained.

Then, the distance from zero peak to primary peak in a profile of an FFT image is obtained. The inverse number of the obtained distance is an average pitch $B_1$ in this area. The step described above is similarly conducted at more than 25 total areas randomly selected areas of more than 25 areas in total. Average pitches $B_1$ to $B_{25}$ in each area is determined. An average of the average pitches $B_1$ to $B_{25}$ in the obtained areas of more than 25 areas is average pitch B in expression (1). In addition, it is preferable to separate each area by at least 1 mm, and more preferable by 5 mm to 1 cm.

Besides, various pitches of the particles in the each image can be evaluated from an area of a primary peak in a profile of an FFT image.

A single particle film etching mask which the misalignment D of the array of the particles is less than or equal to 10%, and also the particle interstice is controlled and precisely aligned. Therefore, a highly precise micro embosses pattern is conducted by forming conically-shaped micro projections in locations corresponding to each particle on a substrate with use of such single particle film etching mask. Such closest packed in two dimensions includes some lattice defects because the closest packed in two dimensions works as self assembly as described later. However, such a lattice defect in closest packed in two dimensions helps to provide a variety of antireflection effects with reduction of reflectance property, like a diffraction grating in case of antireflection purpose in particular to make a variety of filling direction.

A micro structure which has micro embosses patterns and conically-shaped micro projections on a surface thereof is preferably used as high quality antireflection such as an antireflection film by itself. Other than that, the micro structure is preferably used for an original plate to produce a nano imprint mold or a mold for injection molding. The details are discussed below. Bulk production of high quality antireflection at a low cost will be produced stably with use of the mold which is produced by transcribing the original plate to a nano imprint mold or a mold for injection molding.

When an antireflection and the aforementioned original plate are produced with a micro embosses pattern on a substrate, the average particle diameter A obtained by particle-dynamic light scatter method of 3 to 380 nm is used as a method to measure particles of a single particle film etching mask. An average particulate diameter A of particles and the diameter of each circle base of conically-shaped micro projections that are to be formed is approximately the same. Micro embosses pattern for antireflection and suppression of optical dispersion can be preferably formed because the diameter of a circle base of formed conically-shaped micro projections is less than or equal to 380 nm with use of particles of less than or equal to 380 nm which average particle diameter A is smaller than the lower bound wave length of visual light. In addition, a quenching effect with a so-called subwavelength grating can be fully obtained with use of particles with an average particle diameter (A) more than or equal to 3 nm so that enough distance of gradient space of reflection index which incident light passes, can be secured.

In addition, a variation coefficient less than or equal to 20% (the value of the standard deviation divided by a mean value) of a particle diameter of particles which makes up a single particle film etching mask is preferred, a variation coefficient less than or equal to 10% is preferable, and a variation coefficient less than or equal to 5% is more preferable. Thus, the variation coefficient of a particle, more specifically, using small particles of various diameters, makes it difficult to cause a defect which particles do not exist in following single particle film etching mask production. A single particle film etching mask which the misalignment D of the array of the particles is less than or equal to 10% is easily obtained. An antireflection film providing a uniformed refraction index inclined effect for incident light is easily obtained and preferred.

As a particle material, more than one of metals, such as Al, Au, Ti, Pt, Ag, Cu, Cr, Fe, Ni, and Si, metallic oxide such as $SiO_2$, $Al_2O_3$, $TiO_2$, $MgO_2$, and $CaO_2$; polystyrene; organic polymers, such as polymethyl methacrylate; semiconductor materials; and inorganic polymers.

[Production Method of Single Particle Film Etching Mask]

Such a single particle film etching mask should be displaced on at least one side of a substrate which is an etching object, and a method to use a concept of LB method (Langmuir-Blogett method) enables formation of a single particle film etching mask on a substrate. In particular, a single particle film etching mask can be produced by a drip step in which a dispersion liquid of dispersed particles in a solvent is dripped onto a liquid surface of a water tank, a single particle film formation step which forms a single particle film of particles obtained from the previously mentioned volatized solvent, and a transfer step which transfers a single particle film to a substrate.

Preferred methods to produce a single particle film etching mask will be explained below in specific terms with an example.

(Drip Step and Single Particle Film Formation Step)

At first, a dispersed fluid is prepared by adding particles with a hydrophobic surface to a hydrophobic organic solvent including more than one kind of highly volatile solvent such as methanol, chloroform, ethanol, and methyl ethyl ketone. At the same time, a water tank (a trough) is prepared, and water is added to the tank as a liquid to disperse particles on the surface of the liquid (hereinafter, referred to as substratum water).

Then, the dispersed fluid is dripped to a surface of substratum water (a drip step). Then, the particles disperse on the surface of the substratum water along with a volatilization of a dispersed fluid, and a single particle film in which closest packed in two dimensions can be obtained (a single particle film formation production step).

As described above, it is necessary to select a hydrophobic solvent when hydrophobic particles are selected. At the same time, in the above case, the substratum water has to be hydrophilic, and water is usually used.

Self assembly of particles progresses by combining such materials as stated above, and a single particle film in which closest packed in two dimensions can be formed. However, a hydrophobic liquid is selected as the substratum water when particles and a solvent such as hydrophilic are selected.

It is preferred for the particle concentration of dispersed fluid which drips onto the substratum water is 1 to 10% by mass. In addition, it is preferable for the drip speed to be 0.001 to 0.01 ml/second. A single particle film in which each particle is precisely closest packed in two dimensions is easily obtained because the tendency of pitches between particles to widen; particles agglutinate cluster to cause second layer and higher in part; and a defect which particles do not exit can be suppressed when the concentration or the dripped amount of the particles in the dispersed fluid is in the above range.

Among the particles that mentioned in the above as particles of hydrophobic in surface, particles such as organic polymers such as polypstyrene, which its surface is hydrophobic can be used. Besides, particles of hydrophilic in surface can be used as hydrophobic with hydrophobizing agent. For example, surfactant, metallic alkoxysilane can be used for a hydrophobizing agent.

A method to use a surfactant as a hydrophobic agent is effective for hydrophobing a wide variety of materials such as metallic particles and metallic oxides.

Cationic surfactants such as bromination hexadecyl trimethylammonium, and bromination decyl trimethylammonium; and anionic surfactants such as sodium dodecyl sulfate, and 4-sodium octyl benzenesulfonate are preferred as a surfactant. Alkanethiol, a disulphide compound, tetradecanoic acid, octadecanoic acid can also be used.

A hydrophobing step using the above-mentioned surfactants may be conducted in a liquid, such as a solvent or water which disperse particles therein, or may be conducted for a particle in a dry condition.

When hydrophobing step is conducted in the liquid, a particle to be hydrophobed is added to a volatile organic solvent including more than one of, for example, chloroform, methanol, ethanol, isopropanol, acetone, methyl ethyl ketone, ethyl ethyl ketone, toluene, hexane, cyclohexane, ethyl acetate, and butyl acetate to disperse particles. After that, a surfactant is added to continue dispersion. Thus, particles are dispersed in advance and then a surfactant is added. This more uniformly hydrophobes a surface. Such dispersed fluid after hydrophobing can be used as dispersed fluid to drip in the surface of substratum water in drip step.

A method to extract hydrophobic treated particles by adding an organic solvent by oil phase extraction is effective after a hydrophobing step of a particle surface in water phase has been conducted by adding surfactant to the dispersed moisture when particles to hydrophobe is in dispersed moisture condition. Obtained dispersed fluid (the dispersed fluid which particles dispersed in an organic solvent) can be used as a dispersed fluid to drip in the surface of substratum water in drip step. In addition, it is preferred to select and combine adequately various organic solvent and various surfactants in order to raise particle dispersibility of this dispersed fluid. A single particle film in which each particle is precisely closest packed in two dimensions is easily obtained with the use of a dispersed fluid of high particle dispersibility because it can suppress agglutinate cluster. For example, it is preferable to use bromination decyl trimethylammonium as a surfactant when chloroform is selected as an organic solvent. In addition, it is more preferable to combine with ethanol and sodium dodecyl sulfate, combine with methanol and 4-sodium octyl benzenesulfonate, a combination with methyl ethyl ketone and Okuda capric acid.

The ratio of particles to be hydrophobed to a surfactant is preferably in a range of ⅓ to ¹⁄₁₅ times mass of a surfactant against particles to be hydrophobing.

In addition, stirring a dispersed fluid and radiating an ultrasonic to a dispersed fluid during a hydrophobic processing step is effective to improve particle dispersibility.

It is effective to hydrophobe particles, such as Si, Fe, Al; and hydrophobe oxide particles, such as $AlO_2$, $SiO_2$, and $TiO_2$ as a method to hydrophobe particles with metallic alkoxysilane as a hydrophobic agent. However, the method is not limited to the above particles but also the method can be applied to particles having a hydroxyl group on their surface.

Monomethyl trimethoxysilane, monomethyl triethoxysilane, dimethyl diethoxysilane, phenyl triethoxysilane, hexyl trimethoxysilane, decyl trimethoxysilane, vinyl trichlorosilane, vinyl trimethoxysilane, vinyl triethoxysilane, 2-(3,4-epoxycyclohexyl)ethyl trimethoxysilane, 3-glycidoxypropyl trimethoxysilane, 3-glycidoxypropyl methyl diethoxysilane, 3-glycidoxypropyl triethoxysilane, p-styryl trimethoxysilane, 3-methacryloxy propyl methyl diemethoxysilane, 3-methacryloxy propyl trimethoxysilane, 3-methacryloxy propyl methyl diethoxysilane, 3-methacryloxy propyl triethoxysilane, 3-acryloxy propyl trimethoxysilane, N-2(aminoethyl)-3-amino propyl methyl diemethoxysilane, N-2 (amino ethyl)-3-amino propyl trimethoxysilane, N-2(aminoethyl)3-amino propyltriethoxysilane, 3-amino propyl trimethoxysilane, 3-amino propyl triethoxysilane, N-phenyl-3-amino propyl trimethoxysilane, 3-ureido propyl triethoxysilane, 3-chloropropyl trimethoxysilane, 3-mercapto propyl methyl diemethoxysilane, 3-mercapto propyl trimethoxysilane, and 3-isocyanate propyl triethoxysilane can be used as the metallic alkoxysilane.

An alkoxysilyl group of metallic alkoxysilane is hydrolyzed to silanol group when metallic alkoxysilane is used as a hydrophobic agent. Hydrophobizing is conducted so that the silanol group is dehydrated and condensed to hydroxyl group of particle surfaces. Therefore, it is preferable to conduct hydrophobing with the use of metallic alkoxysilane in the water. It is preferable to stabilize the dispersion of particles before hydrophobing is conducted with a combination use of dispersion agent, such as a surfactant and the dispersed particles when hydrophobing is conducted in the water. However, the hydrophobing effect of metal alkoxysilane can be reduced depending on the kind of a dispersing agent, and a combination of a dispersing agent and metal alkoxysilane is required.

For a practical method of hydrophobing a metallic alkoxysilane, at first a particle is dispersed in the water and mixed with a metal alkoxysilane water solution (a water solution including hydrolyzate of metallic alkoxysilane), then is preferably reacted for 6 to 12 hours at a room temperature of 40 degree Celsius while being stirred for a predetermined amount of time. The reaction progresses properly under such condition, and dispersed fluid of fully hydrophobing particles can be obtained. When the reaction progresses excessively, silanol group responds to each particle to bond. The single particle film obtained tends to be made up of more than two layers which particles agglutinate cluster partially because particle dispersibility of dispersed fluid declines. On the other hand, if the hydrophobing reaction is insufficient, hydrophobing of particle surface will be insufficient. Therefore an obtaining a single particle film will be included with particles wide pitches.

In addition, metallic alkoxysilane other than amines is hydrolyzed in acid or alkaline conditions. Therefore, the pH of the metallic alkoxysilane other than amines needs to be adjusted to be made more acidic or alkaline during the reaction. There is no limitation for method used to adjust the pH. However, a method of adding 0.1 to 2.0% by mass of acetic acid is preferred because an effect of silanol group stabilization rather than hydrolysis acceleration is obtained.

The ratio of metallic alkoxysilane to particles to be hydrophobed is preferably in the range of ¹⁄₁₀ to ¹⁄₁₀₀ times.

More than one kind of the aforementioned volatile organic solvents is added to the dispersed fluid after the reaction has continued for a predetermined amount of time. The hydrophobidized particles in the water are extracted using oil phase extraction. For example, the amount of the organic solvent added is preferred in a range of 0.3 to 3 times by volume of the dispersed fluid before the organic solvent was added. The dispersed fluid (the dispersed fluid in which particles are dispersed in an organic solvent) can be used as a dispersed fluid to be dripped into a surface of substratum water in a drip step. In addition, the hydrophobing step preferably includes, for example stirring, ultrasonic irradiation to raise the particle dispersibility of a dispersed stepping fluid in the a hydrophobing step. It is easy to obtain a close packed single particle film in which each particle is preceisely closed packed in two dimensions because particles agglutinate cluster by increasing the dispersibility of the particles in the dispersed fluid.

In addition, it is preferable to remove aggregated particles (second particles made up of multiple primary particles) which exist in the dispersed fluid in order to increase the precision of the formation of a single particle film by fine filtration of the dispersed fluid using a membrane filter before the dispersed fluid is dripped onto the surface of the liquid. Thus, fine filtration in advance enables the production of a highly precise single particle film with fewer defects such as two layered and higher particle films or partially no particles in the particle films. It is difficult to obtain a highly precise single particle film etching mask without being detected a difference of surface pressure even if an LB filter trough device which has a movable barrier that compresses a single particle film in the direction of liquid surface, and a surface pressure sensor which measures the surface pressure of a single particle film in the transcription step discussed below if there are defects several μm in size to several tens of μm in size.

Even more particularly, it is preferable to conduct such a single particle film formation step in an ultrasonic irradiation condition. Conducting a single particle film production step with ultrasonic sound irradiated from substratum water to water surface progresses a closest packed particle and a closest packed single particle film in which each particle is precisely closest packed in two dimension as is obtained. In this case, 1 to 1200 W of ultrasonic output is preferable, and 50-600 W is more preferable. In addition, ultrasonic frequency does not have a limit in particular, but, for example, 28 kHz to 5 MHz is preferable and 700 kHz to 2 MHz is more preferable. Generally, as the frequency becomes increases, energy absorption of water molecule begins, and steam rises from the surface of the water. Therefore, it is unfavorable for use as the LB method of the present invention. In addition, the cavitation radius of what in substratum water grows large when the frequency is decreased, and bubbles generated in the water move towards the surface of the water. A single particle film formation of the present invention becomes inconvenient because surface smoothness of the water is lost if such bubbles integrate beneath a single particle film. In addition, a stationary waves are generated on the surface of the water by ultrasonic irradiation. It is necessary to be careful so that a single particle film is abolished when output of ultrasonic is too high in any frequency, and when the pulse height of the water surface is too high due to the ultrasonic frequency and the tuning of transmitter.

A closest packed of particles can be effectively promoted without abolishing a formed single particle film when ultrasonic frequency is set to "normal" with care. Character frequency calculated from the diameter of the particles is targeted to perform an ultrasonic irradiation. However, it is difficult to provide ultrasonic oscillation as a result of calculation because particles with a diameter less than 100 nm have an extremely high character frequency. In such case, required frequency of ultra sonic can be reduced to a practical range if the character frequency which corresponds to the mass of a particle of dimmer, trimer, . . . 20 mer is hypotheticall calculated. Improvement of particle packing develops when the ultrasonic oscillation corresponding to the character frequency of particulate association is given. Enough ultrasonic irradiation time makes particles rearrange and the time required for ultrasonic irradiation depends on the diameter of the particles, the ultrasonic frequency, and the temperature of the water. However, it is preferable to conduct the production step in 10 seconds to 60 minutes under usual production conditions, and more preferably in 3 minutes to 30 minutes.

Other than the advantage to obtain particles closest packed by ultrasonic irradiation (a closest packed of random array to half dozen); destroying soft-aggregates of particles which tend to be produced during preparation of nano particle dispersed fluid; and restoring point defects, line defects or crystal transformation that once formed are effective.

Formation of the above explained single particle film is due to self assembly of particles. The principle is that when particles gather, surface tension acts on the particles existing in the dispersed fluid. As a result, a closest packed structure in two dimensions is automatically formed instead of random particles. It may be also said that closest packed by such surface tension is called arrangement by capillarity force in a transverse direction.

Particles with high uniformity in diameter and round like a colloidal silica contact in the form of three colloidal silicas floating on a water surface. Surface tension acts so that the total length of the draft line of the particle group minimum. The three particles P shown in FIG. 1 stabilize at a place based on an equilateral triangle, shown as T in FIG. 1. Such self assembly does not occur and a single particle film would not be formed if the draft line comes to a peak of particle group, in other words, when particle P goes under the surface of the water. Therefore, it is important not to let a particle group go under the surface of the water. When one of particle or substratum is hydrophobic, the other needs to be hydrophilic.

It is preferable to use water in substratum water as stated above. One formed a closest packing arrangement tends to stabilize on the surface of a liquid due to an action of comparatively large surface free energy if water is used.

(Transfer Step)

A single particle film formed on the surface of a liquid by a single particle film formation step is moved onto a substrate which is an etching object by keeping the single layer (transfer step). A substrate may be planar, or may have curve surfaces, slants, or non-planar shapes such as level differences in part or all of the substrate. A single particle film of the present invention is able to coat a surface of a substrate by maintaining closest packed in two dimensions without having a planar surface of the substrate. There is no particular limitation in the method used to transfer a single particle film to a substrate. For example, a transfer method to transfer a single particle film to a substrate by affinity of hydrophobic substrate and a single particle film by keeping the hydrophobic substrate and the single particle film substantially parallel and letting the substrate contact the single particle film from above. Also, there is a method to transfer a single particle film to a substrate by descending a liquid surface gradually after forming the single particle film on the liquid surface by displacing the substrate substantially horizontal to substratum water of a water tank before the single particle film is formed. A single particle film can be transferred to a substrate without using a special device using to these methods. However, it is preferable to use an LB trough method in a point of transferring the single particle film while keeping the closest packed in two dimensions when the single particle film is a large-sized single particle film (Journal of Materials and Chemistry, Vol. 11, 3, 333 (2001), Journal of Materials and Chemistry, Vol. 12, 3, 268 (2002)).

Figure 2A:
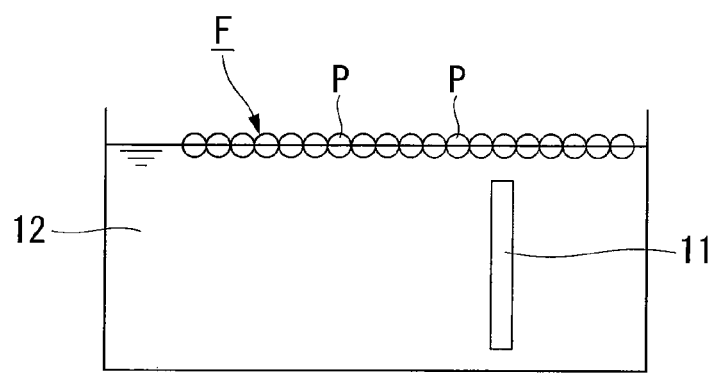
FIG. 2A is a schematic diagram shows an example of a production method of a single particle film etching mask
Figure 2B:
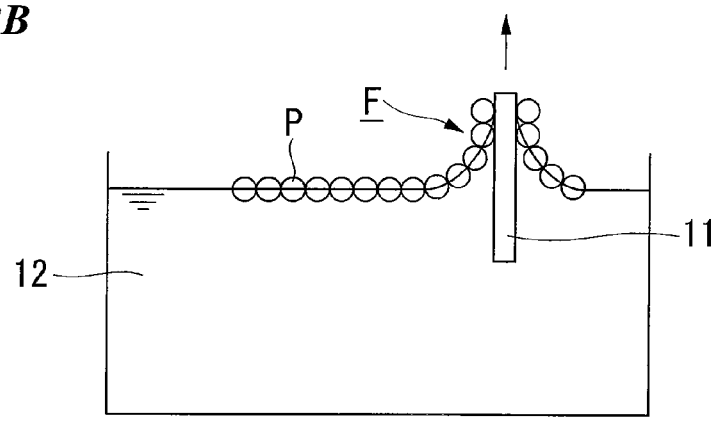
FIG. 2B is a schematic diagram shows an example of a production method of a single particle film etching mask

FIG. 2 represents an outline of a typical LB trough method. In this approach, substrate 11 is dipped into substratum water 12 in a water tank beforehand in substantially a vertical direction. The aforementioned drip step and a single particle film formation step are conducted in the state above, and a single particle film F is formed (FIG. 2A). Then, the single particle film F is transferred to the substrate 11 by raising the substrate 11 upward after a single particle film formation step takes place (FIG. 2B). In addition, FIG. 2B shows the state of transfer of a single particle film F to both sides of the substrate 11. A single particle film F can be transferred to one side of the substrate when micro embosses pattern such as an antireflection is produced on one side of the substrate.

Even if the temperature in the transfer step (of the substratum water) or the speed the substrate 11 is pulled up is changed by some measure, the single particle film F is less likely to be multi layered by the collapse of the single particle film F in the transfer step because the single particle film F has already been formed in a single layer state on the surface of a liquid in the single particle film formation step. In addition, the temperature of the substratum water usually depends on the surrounding temperature which fluctuates by season or weather, and the temperature is approximately 10 to 30 degrees Celsius.

In addition, a single particle film F of a large area can be transferred more stably to the substrate 11 with the use of LB trough device having a movable barrier of substantially diagrammatic representation to compress the single particle film F in the direction along with a liquid surface, and a surface pressure sensor as a principles of Wilhelmy plate of substantially represented in a diagram to measure surface pressure of the single particle film F as a water tank. The single particle film F can be compressed increasing the (density) to a preferred diffusion pressure while measuring the surface pressure of the single particle film F by the devices. Also, the single particle film can be moved in constant speed toward the substrate 11. Therefore a trouble such as a single particle film of a small area only being able to transfer to a substrate is less likely to happen because the transfer of the single particle film F from the surface of the liquid to the substrate 11 proceeds smoothly. The preferable diffusion pressure is 5 to 80 $mNm^{-1}$, and the more preferable diffusion pressure is 10-40 $mNm^{-1}$. A single particle film F in which each particle is precisely closest packed in two dimensions is easily obtained in the diffusion pressures mentioned above. In addition, the speed, the substrate 11 is pulled up is preferably 0.5-20 mm/min. The temperature of the substratum water is usually 10 to 30 degrees Celsius as mentioned above. In addition, an LB trough device can be obtained as a commercial product.

The material of a substrate can be arbitrarily selected according to the use thereof. For example, semiconductors such as silicon and gallium arsenic; metals such as aluminum, iron and copper; metallic oxide such as glass, silica glass, mica and sapphire ($Al_2O_3$); and high polymeric materials such as polyethylene terephthalate (PET), polyethylenenaphthalate, triacetylcellulose can be used. In addition, a surface of a substrate may be coated with other materials, and may also be changed chemically. For example, a transparent body such as glass, silica glass, or a high polymeric material having transparency is preferable as a substrate material when a micro structure obtained from the later etching step is used as antireflection. Silica glass and silicon as substrate materials can be used widely as etching objects when they are used as the original plates of a nano imprint mold in order to produce an antireflection. In addition, it is preferable to use highly smooth materials.

The thickness of a substrate is not particularly limited. However, it is preferable to use a substrate with a thickness of 10 to 500 µm when a micro structure is used as an antireflection and improvement of visibility is conducted by attaching a micro structure which obtained from the following etching step, to surfaces such as PC displays, display windows, display frames, a variety of lenses, and a variety of display windows. On the other hand, an obtained micro structure may be used on transparent materials such as display windows, PC displays, display windows, display frames, a variety of lenses and a variety of displays windows. In such cases, the thickness of the micro structure can be set to a preferable thickness.

In addition, it is preferable to use a substrate with a thickness of 100 to 5000 µm when an obtained micro structure is used as the original plate of a nano imprint mold or a mold for injection molding.

A single particle film etching mask can be formed on a substrate by such transfer step. However, a fixing step to fix the formed single particle film etching mask to the substrate can be conducted after the transfer step. The possibility of particles moving over the substrate during the etching step described later can be suppressed by fixing the single particle film on the substrate, and highly precise etching can be conducted more stably. In particular, the possibility of moving particles over the substrate during the etching step will be larger in the final stage of the etching step which diameter of each particle is gradually getting smaller.

Methods which use a binder or a sintering can be used as a fixing step.

In a method using a binder, provide a binder solution is provided the single particle film side of the substrate where the single particle film etching mask was formed. Then, soak the single particle film formed on the substrate in the binder solution between the single particle film etching mask and the substrate.

The amount of consumed binder is preferably 0.001 to 0.02 times the mass of the single particle film etching mask.

A particle can be fixed enough in the above range without negatively affecting the precision of the single particle film etching mask because of the presence too much binder which causes a clog between particles. To remove the extra binder solution, use a spin coater or tilt a substrate after the single particle film formed on the substrate has been soaked in the binder solution if too much binder solution had been provided.

Metallic alkoxysilane which was mentioned earlier as a hydrophobic agent, general organic binder, and an inorganic binder can be used as the binder. Arbitrarily heat treatment may be conducted for a particular type of binder after r the single particle film formed on the substrate has been soaked in the binder solution.

It is preferable to heat-treat the substrate at 40 to 80 degrees Celsius for 3 to 60 minutes when metallic alkoxysilane is used as the binder.

A single particle film etching mask having each particle is fuse bonded to a substrate by heating the substrate of which the single particle film etching mask is formed during a sintering step. The heating temperature to be used can be determined by the materials of which the particles or substrate is formed. However, particles with a diameter less than or equal to 1 µmφ start their surface reaction at a lower temperature than the fusing point of the original material. Therefore, all of the sintering is at a comparatively low temperature. The particulate fusion area increases when the heating temperature is too high. As a result, it is possible to affect the precision such that the shape of the single particle film etching mask changes. Also, heating in the air can make the substrate and each particle oxidize. Therefore, it is necessary to set etching condition based on the oxidation possibility during the later described etching step. For example, a silicon substrate is used as a substrate. When the substrate is sintered at 1,100 degrees Celsius, a thermal oxidation layer is formed at about a 200 nm thickness at the surface of the substrate.

The method to produce a single particle film etching mask includes a drip step which a dispersion liquid of dispersed particles in a solvent is dripped into the surface of a liquid in a water tank, a single particle film formation step which forms a single particle film of particles obtained from a volatized solvent, and a transfer step which transfers the single particle film to a substrate. Therefore, the production method is much superior to particle adsorption method which is described in the patent document 1 or the thin liquid method which is described in Nature, Vol. 361, Jan., 26 (1993) because the production method forms a precise single layer is easy to manipulate, can be applied to a large area, and it repeatable. Therefore, the method can be conducted at industrial production level.

[Micro Structure and the Production Method]

Figure 3A:
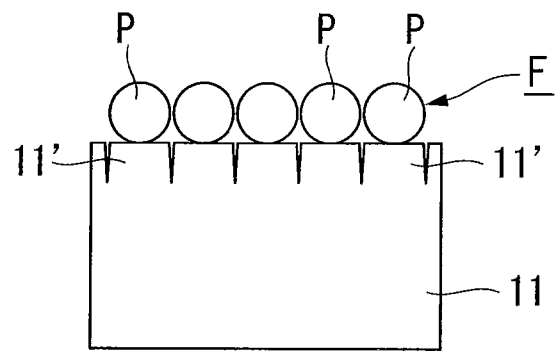
FIG. 3A is an illustration diagram shows a production method of a micro structure.
Figure 3B:
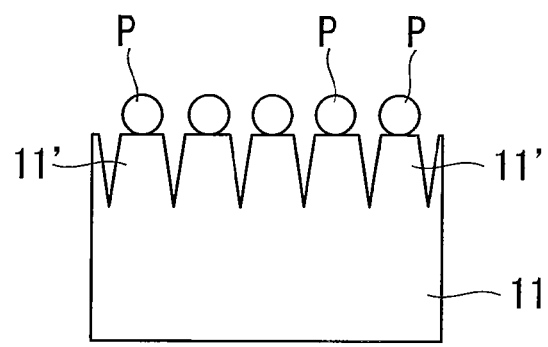
FIG. 3B is an illustration diagram shows a production method of a micro structure.
Figure 3C:
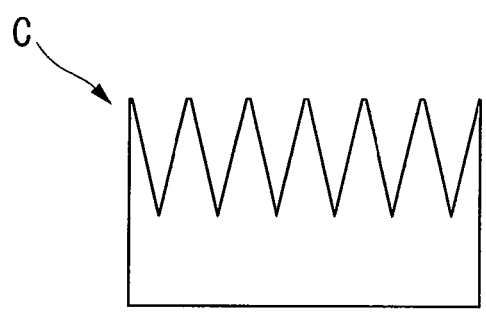
FIG. 3C is an illustration diagram shows a production method of a micro structure.

Many conically-shaped micro projections can be formed on one side of a substrate in a surface processing step (etching step) by gas phase etching the substrate which has the single particle film etching mask are on the side. Etching gas goes through the gap of single particle film F having each particle P when a gas phase etching is initiated as shown in FIG. of 3A, and the gas arrives at the surface of the substrate 11. Then, a ditch is formed on the substrate 11, and column 11' appears in a location corresponding to each particle P is located. If gas phase etching is applied continuously, particle P on the each column 11' would be gradually decrease in size due to etching and the ditch of the substrate 11 would simultaneously be deepened (FIG. 3B). Then, each particle P finally is removed by etching. Instead, a conically-shaped micro projection is formed on one side of the substrate 11 (FIG. 3C).

The obtained micro structure C can be used as an antireflection in the surface of a PC, a cellular phone, a variety of displays units (for example, an LCD, a plasma display, a rear projector, an FED, and an FPD such as OLED), window glass such as a display window, display frames, a variety of displays window, optical lenses, a solar battery, and optical materials having advertising displays and/or road signs. The micro structure C can also be used as an original plate of a nano imprint mold to produce these antireflections.

It is preferable to form each conically-shaped micro projection with a bottom diameter of 3 to 380 nm from the antireflection effect point of view by suppressing optical scattering in the micro structure of such applications. Particles with an average particle diameter A of 3 to 380 nm can be used for the single particle film etching mask as previously mentioned. In addition, the height of each conically-shaped micro projection is preferably more than or equal to 50 nm and the aspect ratio of the conically-shaped micro projection of the height to the diameter of the bottom circle is preferably more than or equal to 0.5. The height and the aspect ratio enables the suppression of Fresnel reflection of incident light which comes from the conically-shaped micro projection side because enough refraction index inclined effect can be obtained at the portion where a conically-shaped micro projection is formed. However, the micro structure of the present invention is not limited to the antireflective purpose stated above. The micro structure of the present invention can also be used for optical scattering purposes when the pitch is bigger such as from 2 μm to 40 μm.

A conically-shaped micro projection with a height more than or equal to 50 nm is preferable, a height more than or equal to 100 nm height is more preferable, and a height more than or equal to 300 nm height is much more preferable. The upper limit of the height of a preferred conically-shaped micro projection is 20 μm.

An aspect ratio of a conically-shaped micro projection of the height to the diameter of the bottom circle is preferably more than or equal to 1.0, and more preferably more than or equal to 2.0. On the other hand, the upper limit of a preferred aspect ratio is 10 when a micro structure is used as antireflection purpose. Preferred upper limit of aspect ratio is 5.0 when a micro structure is used as an original plate of a nano imprint mold or a mold for injection molding.

Etching gases used for gas phase etching are, for example, Ar, $SF_6$, $F_2$, $CF_4$, $C_4F_8$, $C_5F_8$, $C_2F_6$, $C_3F_6$, $C_4F_6$, $CHF_3$, $CH_2F_2$, $CH_3F$, $C_3F_8$, $Cl_2$, $CCl_4$, $SiCl_4$, $BCl_2$, $BCl_3$, $BC_2$, $Br_2$, $Br_3$, HBr, $CBrF_3$, HCl, $CH_4$, $NH_3$, $O_2$, $H_2$, $N_2$, CO, and $CO_2$. However, the present invention is not limited to the above examples and other gases can be used. More than one of etching gases can be used corresponding to a material of the substrate or particles including a single particle film etching mask.

A gas phase etching is conducted in an anisotropic etching where the etching speed is faster in the vertical direction than in the horizontal direction of a substrate. Usable etching devices such as a reactive etching device and an ion beam etching device enable to carry out anisotropic etching. There is no particular limitation of a formula of a plasma outbreak, a structure of electrode, a structure of a chamber, and frequency of a high frequency source if an etching device can produce a biased electric field of s minimum of approximately 200 W.

It is necessary for a single particle film etching mask and substrate to be etched at different speed in order to conduct anisotropic etching. It is preferable to set each etching condition (material of particle making up the single particle film etching mask, the substrate material, the type of etching gas used, the bias power, the antenna power, the flow rate and pressure of the gas, and the etching time) in the etching selectivity ratio of preferably more than or equal to 1, more preferably more than or equal to 2, and much more preferably more than or equal to 3.

For example, a gold particle is selected as a particle making up a single particle film etching mask when a glass is selected as the substrate, the etching speed of the gold particle decreased if an etching gas such as $CF_4$ or $CHF_3$ that is reactive with glass are used, and the glass substrate would be etched.

A colloidal silica particle is selected as a particle arranging a single particle film etching mask when a PET substrate is selected as the substrate, selective physical etching of a relatively soft PET substrate can be conducted by using an inert gas such as Ar as the etching gas.

In addition, positive charged particles in the etching gas with plasma state is accelerated and incident almost perpendicularly to a substrate at high-speed when bias of electric field is set from several tens Watt to several hundreds Watt. Therefore, the reaction speed of physical etching in a vertical direction can be increased if a gas which reacts with the substrate is used.

Isotropic etching by a radical which was generated by plasma is also generated along with a gas phase etching in some combination of substrate material and types of etching gas. An etching by a radical is chemical etching, and is conducted isotropically in any direction on an etching object. The radical does not have an electric charge, etching speed by setting of the bias power cannot be controlled, and therefore etching speed can be controlled by the density of etching gas (flow quantity) in the chamber. When a reactive gas is used, the influence of a radical cannot be null, because some gas pressure has to be maintained in order to conduct an anisotropic etching using an electrically-charged particle. However, a technique which slows the reaction speed of a radical by cooling a substrate is broadly used. Therefore, it is preferable to use a device which possesses these features.

In addition, it is necessary for the shape of a formed projection to be a cone, when an obtained micro structure is used as an antireflection and when an original plate of a nano imprint mold or a mold for injection molding is used for production of antireflection. However, a side of a cone (side wall) is etched in the step of change from column-shape to conical-shape of a projection as shown in FIG. 3 in the actual etching step. As a result, the slant of the side wall of the formed conically-shaped micro projection tends to be big and the ditch shape of the longitudinal section of the cones that lie next to each other tend to be U-shaped rather than V-shaped. Restraint of Fresnel reflection of an incident light may become insufficient because enough refraction index inclined effect cannot be exerted when such shape is formed. Therefore, it is preferable to make the projection shape a more ideal conical shape by protecting the formed side wall by etching with an improved of aspect ratio by applying a so-called Bosch method in the etching step of the present invention.

In other words, after disassembly of an etching gas of Freon, such as $C_4F_8$, $C_5F_8$, $C_2F_6$, $C_3F_6$, $C_4F_6$, $CHF_3$, $CH_2F_2$, $CH_3F$, or $C_3F_8$ was in a plasma state, the disassembled gas is polymerized by binding. Formation of a deposited film consisting of a material such as Teflon (a registered trademark) in the surface of an etching object is known. Such a deposited film acts as an etching coating film because it has an etching tolerance. In addition, a top coat of $SiO_2$ can denature the side wall which was formed by an etching by introducing $O_2$ as a part of the etching gas when the etching selectivity ratio that etching gas to use for silicon is high and the substrate is a silicon substrate. In addition, an etching protective film of the hydrocarbon can be set by using a mixture of $CH_4$ and $H_2$ as the etching gas.

Therefore, it is preferable to perform an etching step while forming an etching protective film at the point that can form an ideal conically-shaped micro projection by selecting a proper etching gas.

Regarding the obtained micro structure, the average pitch C of an array of the conically-shaped micro projections is calculated by a method similar to the one used to calculate the average pitch B of an inter-particle in the previously mentioned single particle film etching mask. The value of the average pitch C is approximately the same as the average pitch B of single particle film etching mask used. In addition, an average pitch C of an array is equivalent to the average value of diameter d of the circular bottom of a conically-shaped micro projection. Even more, a misalignment D'(%) of an array which defined in the following equation (2) is less than or equal to 10%.

$$D'[\%]=|C-A|\times 100/A \qquad (2)$$

However, in the equation (2), A is the average particle size of the particles constituting the single particle film etching mask used.

[Mold for Nano Imprint or Injection Molding, and the Production Method]

A conically-shaped micro projection of a micro structure is transcribed to a metal layer by removing the metal layer (transcription production-step), for example, after the metal layer is formed on the surface of the conically-shaped micro projection of the micro structure when a nano imprint mold or a mold for injection molding is produced with the use of a micro structure as an original plate of a nano imprint mold or a mold for injection molding. As a result, a metal layer having conically-shaped micro projections can be obtained in the surface and this can be used as a nano imprint mold or a mold for injection molding.

A plating method is preferred as a method to form a metal layer on the surface of the conically-shaped micro projection of the micro structure. In particular, nonelectrolytic plating or evaporation coating of more than one of the following metals is selected: nickel, copper, gold, silver, platinum, titanium, cobalt, tin, zinc, chromium, gold-cobalt alloy, gold-nickel alloy, nickel-cobalt-phosphorus alloy solder, copper-nickel-chromium alloy, tin-nickel alloy, nickel-palladium alloy, or nickel-cobalt-phosphorus alloy. In addition, a method to increase the thickness of the metal layer by electrolysis plating by metal more than one kind chosen among these metal is preferable.

A thickness of the metal layer more than or equal to 10 nm achieved by nonelectrolytic plating or evaporation coating is preferable. A thickness more than or equal to 100 nm is more preferable. However, a thickness of 50 nm is generally required for a conductive layer. The bias of the current density in the cover plating side can be suppressed in the next step of electrolytic plating if the thickness of the film is set to be within the range above. Therefore, a nano imprint mold or a mold for injection molding of uniformed-thickness can be easily obtained.

It is preferable to remove the metal layer from the original plate after thickening the metal layer to a final thickness of 10 to 3000 μm in the following electrolyic plating step. The current density in electrolyic plating does not have the limit in particular. However, 0.03 to 10 $A/m^2$ of the current density during electrolyic plating is preferred because it can form a metal layer by suppressing a bridge and in a relatively short amount of time.

Nickel is preferably the material used to form the metal layer, and Nickel is also preferable for the both electroless plating/vapor deposition to perform first and electrolysis plating to perform later from the point of the re-workability, such as abrasion resistance of a nano imprint or a mold for injection molding, removing and pasting of metals.

The average pitch E of the conically-shaped micro projection array is calculated by a method similar to the one used to calculate the average pitch B of an inter-particle in the previously mentioned single particle film etching mask in the obtained nano imprint mold or mold for injection molding. The value of the average pitch E is approximately the same as the average pitch B of the single particle film etching mask used. In addition, the average pitch E of the conically-shaped micro projection array is equivalent to the average value of diameter d of circular bottom of a conically-shaped micro projection. Even more, a misalignment D"(%) of an array which is defined in the following equation (3) is less than or equal to 10% in nano imprint mold or mold for injection molding.

$$D''(\%)=|E-A|\times 100/A \qquad (3)$$

However, in the equation (3), A is the average particle size of the particles constituting the single particle film etching mask used.

[Device of Nano Imprint or Injection Molding, and Product of Nano Imprint or Injection Molding]

A highly precise conically-shaped micro projection can be formed, and a nano imprint product or injection molding product (micro structure) which is suitable for antireflection can be stably and repeatedly produced in large quantity by device of a nano imprint or an injection molding that have a nano imprint mold or a mold for injection molding, respectively.

There is no limitation in formalities in a nano imprint device or an injection molding device. There are some known methods of such as; a heat imprint method which transcribes a micro pattern which is formed in a nano imprint to the substrate is produced by pressing a mold for nano imprint against a substrate which is made in thermoplastic resin of softens by heat and then removes the mold for nano imprint from the substrate after cooling the substrate. Light (UV) imprint method which transcribes micro pattern formed in the mold for nano imprint to the substrate is produced by pressing a mold for nano imprint against a substrate of visible light curing resin of uncured resin and then removes the mold for nano imprint from the substrate after hardening visible light curing resin by irradiating ultraviolet light. Injection molding method which transcribes micro pattern formed in the mold for injection molding to the surface of the molding is produced by projection flowing melted resin to a mold in high voltage, and then removes the mold after cooling step of the whole mold.

Nano imprinting device of a heat imprint method has a skeleton framework of nano imprint mold which has a press method, and temperature control method which controls the temperature of a substrate. Nano imprinting device of a light (UV) imprint method has a skeleton framework of nano imprint mold which has a press method, and ultraviolet curing method which irradiates ultraviolet to a substrate. In addition, an injection molding device has a skeleton framework and possesses the features of mold clamping, melting of plastic materials, pressure infusion for an air pocket of closed mold and cooling step in an injection molding producing machine which sealed mold is set in a injection molding device.

The average pitch F of an array of the conically-shaped micro projection is calculated using a method similar to the method used to calculate the average pitch B of inter-particle in the previously mentioned single particle film etching mask about the obtained nano imprint or mold for injection molding. The average pitch F is approximately the same as the average pitch B of the single particle film etching mask used. In addition, the average pitch F of an array is equivalent to an average same as the diameter d of circular bottom of a conically-shaped micro projection. Even more, a misalignment D'''(%) of the array which is defined in the following equation (4) is less than or equal to 10% in nano imprint product or mold for injection molding product.

$$D'''(\%)=|F-A|\times 100/A \qquad (4)$$

However, in the equation (4), A is the average particle size of the particles constituting the single particle film etching mask used.

As already discussed above, the single particle film etching mask on which each particle is precisely aligned and closest packed in two dimensions. A micro structure, such as a highly precise antireflection, an original plate of a nano imprint mold or a mold for injection molding can be produced by using the previously discussed single particle film etching mask. A nano imprint mold or a mold for injection molding is produced when an original plate of a nano imprint mold or a mold for injection molding is produced in particular. Antireflection, such as a nano imprint product or an injection molding product (micro structure), can be stably and repeatedly produced in large amounts by using a nano imprint device or an injection molding device which has the feature above. Also, it is suitable for use in industry.

EXAMPLE

Example 1

Dispersed moisture (dispersed fluid) of 5.0% by mass of spherical colloidal silica with an average particle diameter is 298.2 nm and the variation coefficient of particle diameter is 6.7%, was prepared. In addition, the variation coefficient of a particle diameter and an average particle diameter was calculated from the peak which it was obtained from Gaussian curve fitted with the particle size distribution based on particle dynamic light scattering method. For a measuring device, a Zetasizer Nano-ZS made by Malvern Instruments Ltd Corporation which can measure the diameter of particles with a particle diameter less than or equal to 10 nm to an accuracy of about 3 µm using dynamic light scattering. Then, this dispersed fluid is filtered using a membrane filter within an aperture of 1.2 µmφ, and a hydrolyzate water solution of phenyltriethoxysilane of 1.0% by mass is added to the dispersed fluid which has passed through the membrane filter. The solution was reacted at approximately 40 degree Celsius for 3 hours. Dispersed fluid and a hydrolysis water solution were mixed so that the mass of phenyltriethoxysilane became 0.02 times mass of a colloidal silica particle.

An amount of methyl ethyl ketone 4 times as large by volume as the amount of dispersed fluid was added to the dispersed fluid which has completed the previous reaction, and stirred well. Then, hydrophobing colloidal silica was extracted by oil phase extraction.

0.91% by mass of a dispersed hydrophobing colloidal silica was dripped at a drip speed of 0.01 ml/second to a liquid surface (water was used as substratum water, and water temperature was 25 degrees Celsius) of a water tank (LB trough device) containing a movable barrier which compressed a single particle film to the direction along the liquid surface, and a surface pressure sensor which measures the surface pressure of a single particle film. In addition, using a four-inch silicon wafer (thickness: 525 µm) as a substrate was dipped beforehand in substantially vertical direction in a substratum water of a water tank.

After that, a single particle film was formed by volatilizing a methyl ethyl ketone which is a solvent of dispersed fluid with inducing particles to be closest packed in two dimensions by irradiation ultrasonic wave (300 W output, 950 kHz frequency) for 10 minutes facing to the liquid surface from the substratum water.

Then, the single particle film was transcribed to one surface of a substrate by compressing the single particle film to be 25 mNm$^{-1}$ diffusion pressure by movable barrier, and pulling the four-inch silicon wafer at a speed of 5 mm/minute.

Next, an extra hydrolyzed solution was removed by a spin coater (3000 rpm) for one minute after soaking the hydrolyzed solution of 1% by mass of monomethyl trimethoxysilane as a binder on the silicon wafer that single-particle film was formed. After that, a silicon substrate with a single particle film etching mask having colloidal silica was obtained by letting the binder react with the substrate which was heated at 100 degrees Celsius for 10 minutes.

Figure 4:
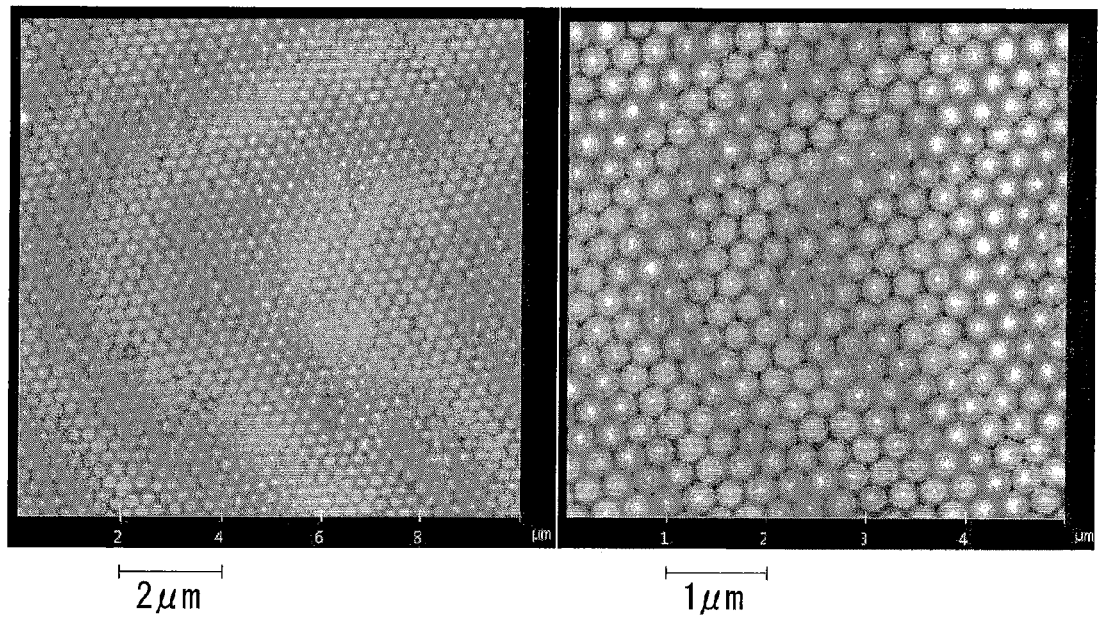
FIG. 4 is a microscopic image of an atomic force of a single particle film etching mask of example 1.

An atomic force microscope image of the formed single particle film etching mask is shown in FIG. 4 with two different levels of magnifications.

Figure 5:
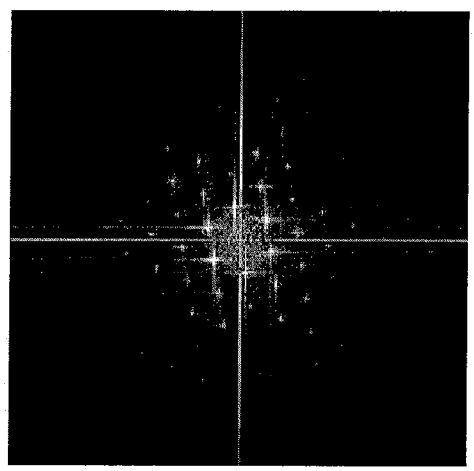
FIG. 5 is a FFT image obtained by performing a waveform separation by Fourier transformation wherein the microscopic image of the atomic force in FIG. 4.

On the other hand, an atomic force microscope image of the area of 10 µm X 10 µm which an area is randomly selected in the single particle film etching mask. In addition, the waveform separation of the image by Fourier transform was conducted and an FFT image shown in FIG. 5 was obtained.

Figure 6:
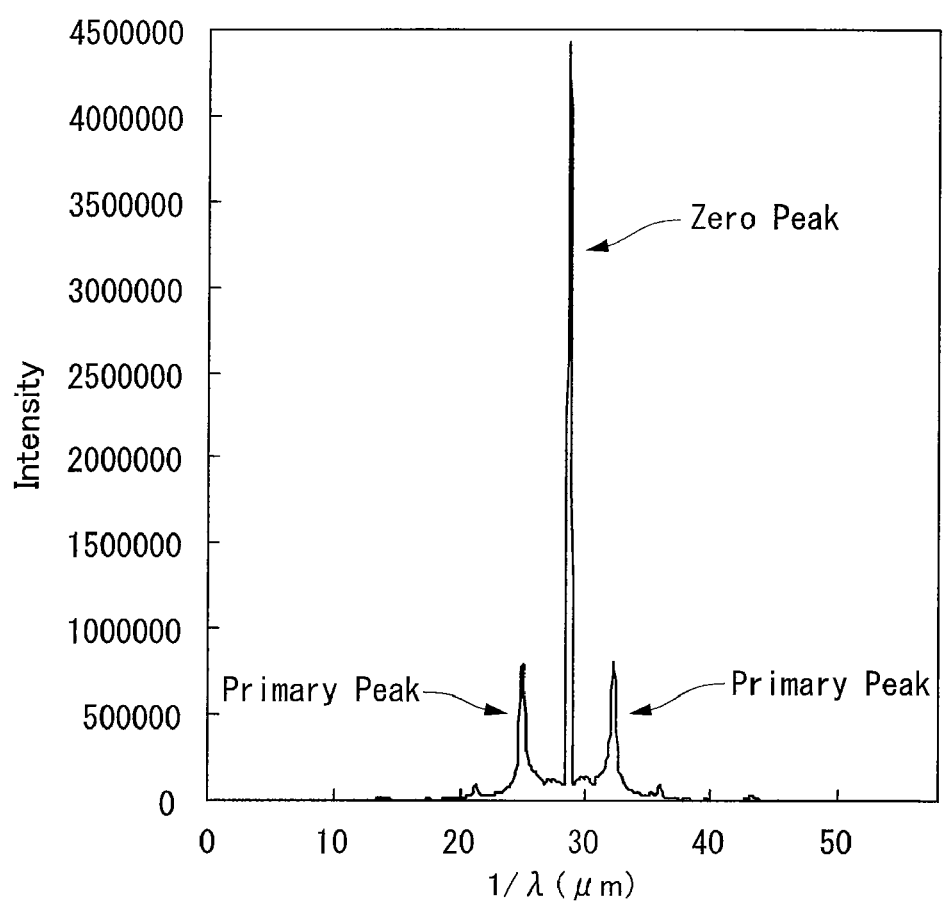
FIG. 6 is a graph shows a profile of an FFT image of FIG. 5.

Then, the distance from the zero peak to the primary peak was calculated from the profile obtained from the FFT image of FIG. 6. In addition, the inverse number of the distance from the zero peak to the primary peak was calculated. This inverse number is the average pitch $B_1$ between particles in the area.

The step was conducted in a total of 25 areas of 10 µm×10 µm, and the average pitch of $B_1$ to $B_{25}$ of each area was calculated. Then, the average of these was calculated, and the average was expressed as the average pitch B in equation (1). In addition, each area was set so that each area of next to each other was separated in 5 mm to 1 cm.

The calculated average pitch B was 296.3 nm as shown in table 1.

Thus the misalignment D of the array of the particle on the single particle film etching mask was 0.7% as shown in table 1 when the average diameter of the particle A of 298.2 nm and the average pitch B of 296.3 nm were substituted to the equation (1).

In addition, a primary peak area (a relative value) in a profile of FIG. 6 was calculated and the value was shown in table 1.

Figure 7A:
FIG. 7A is a scanning electron microscopic image of a surface profile of a single particle film etching mask substrate in an etching step (Example 1).
Figure 7B:
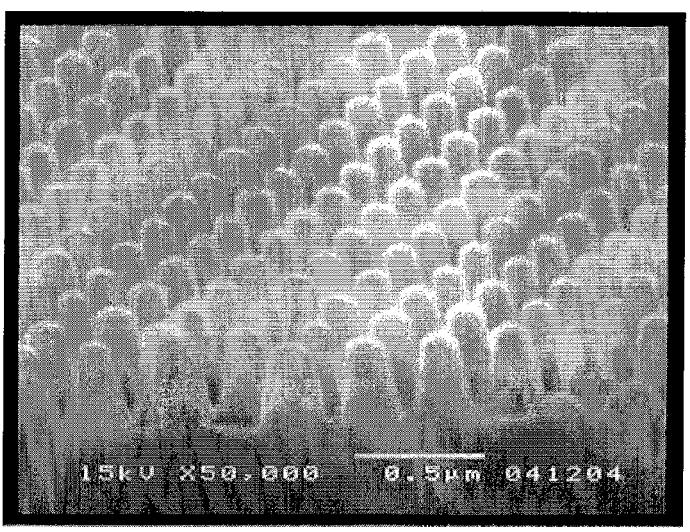
FIG. 7B is a scanning electron microscopic image of a surface profile of a single particle film etching mask substrate in an etching step (Example 1).
Figure 7C:
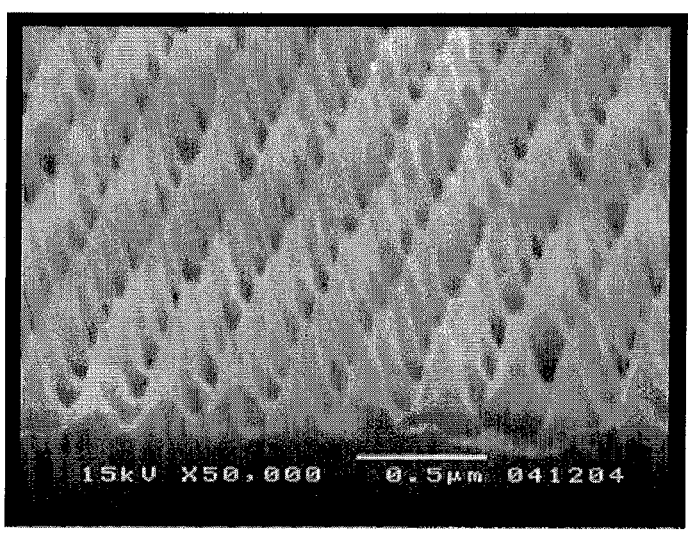
FIG. 7C is a scanning electron microscopic image of surface profile of a single particle film etching mask substrate in an etching step (Example 1).

Then, gas phase etching was performed to a substrate having a single particle film etching mask using a mixed gas of $SF_6$ and $CH_2F_2$ at a ratio of 25:75 to 75:25. The etching conditions were an antenna power of 1,500 W, a bias power of 50 to 300 W, a gas flow of 30 to 50 sccm, and etching selection ratio of 1.1 to 1.5. FIG. 7 is a scanning electron microscope image of a surface profile of the substrate with a single particle film etching mask varying with such a gas phase etching. When a gas phase etching is initiated as shown in FIG. 7A, etching gas goes through a gap of each particle arranging single particle film etching mask, and the gas arrives at the surface of the substrate. Then, a ditch is formed at the site, and an each column appeared right under the each particle. A particle on each column is gradually etched and it becomes smaller as shown in FIG. 7B, as gas phase etching continues. At the same time, a ditch of the substrate is deepened, and each particle disappears by an etching as shown in FIG. 7C for the last. Also, a micro structure body which conically-shaped micro projections were formed on one side of the substrate was obtained.

Figure 8:
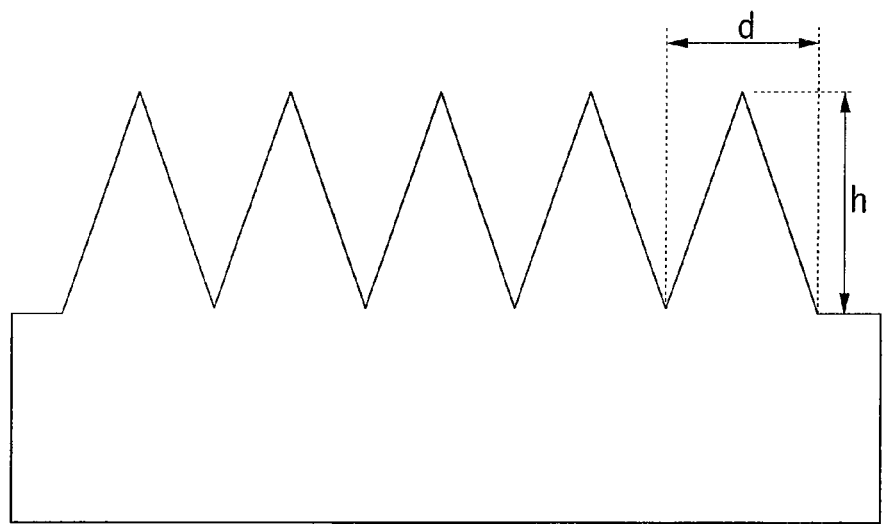
FIG. 8 is a longitudinal section in a simple form showing a micro structure obtained in example 1.

According to the scanning electron microscope image, the obtained micro structure has a figure of longitudinal section of the micro structure in FIG. 8. The average height h of a conically-shaped micro projection measured from the atomic force microscope image was 330 nm, and the average pitch C (average diameter d of circular bottom) of the conically-shaped micro projections which were calculated by the same methods used in the single particle film etching mask was 296.3 nm. The aspect ratio calculated was 1.1.

In addition, the average height h of a conically-shaped micro projection was calculated as follows. At first an atomic force microscope image was obtained from one area of 5 µm×5 µm selected in a micro structure at random, and a profile along a diagonal line direction of an image was made. Then, the average of the unevenness area showed in the area was calculated. This step was conducted similarly at randomly selected areas of total 25 areas of 5 µm×5 µm each, and the average value in each area was calculated. The each averaged value of the 25 places of the obtained value was further averaged to obtain a height h. Projections of 23±2 are included on each diagonal line.

Then, a misalignment D' of the array of the conically-shaped micro projections calculated by equation (2) for this micro structure was 0.7%.

Figure 9:
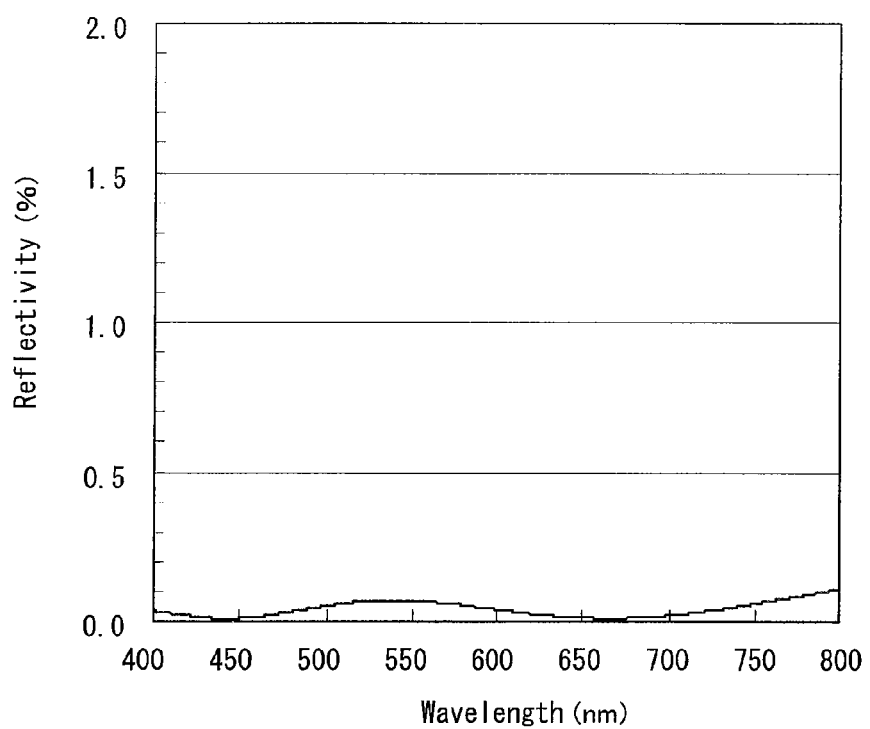
FIG. 9 is a graph showing the results of measuring visible light reflectance by a vertical incidence in a micro structure obtained in example 1.

In addition, in the micro structure, the results that determined visible light reflectance by a vertical incidence are represented in FIG. 9.

An obtained micro structure was used as an original plate of a mold for nano imprint. Ni electroless plating was conducted in the surface which conically-shaped micro projection was formed to produce a Ni layer with a thickness of 50 nm. Then, Ni electrolytic plating (nickel sulfamic acid bath was used) was conducted for current density of 8 A/m$^3$ with an attaching electrode jig to the surface on which a conically-shaped micro projection was formed. The thickness of the final Ni layer was adjusted to be approximately 300 µm. The Ni layer was slowly removed from the micro structure after the plating step, and a mold for nano imprint made by Ni was obtained.

Example 2

Dispersed moisture (dispersed fluid) of 3.0% by mass of spherical colloidal silica with the average particle diameter of the spherical colloidal silica is 118.5 m and the variation coefficient of particle diameter is 4.2%, was prepared. In addition, the variation coefficient of the spherical colloidal silica diameter and an average particle diameter of the spherical colloidal silica were obtained as in example 1. Then, this dispersed fluid is filtered in a membrane filter with an aperture 200 nmφ, and a 50% by mass of bromination hexadecyltrimethylammonium (surfactant) was added to the dispersed fluid which passed through the membrane filter so that the concentration is 2.5 mmol/L. The solution was stirred for 30 minutes, and the bromination hexadecyltrimethylammonium was absorbed by the surface of the colloidal silica particle. Dispersed fluid and bromination hexadecyltrimethylammonium were mixed so that mass of bromination hexadecyltrimethylammonium became 0.04 times mass of a colloidal silica particle.

In addition, the volume of this dispersed fluid and the same volume of the chloroform were added to this dispersed fluid, and it was stirred well. Then, a hydrophobic colloidal silica was extracted by oil phase extraction.

A hydrophobing colloidal silica dispersed fluid of 1.5% by mass was dripped at a drip speed of 0.01 ml/second into a liquid surface (water was used as the substratum water, and the water temperature was 25 degrees Celsius) of a water tank (LB trough device) which possessed the mobile barrier which compressed a single particle film in the direction along the surface, and a surface sensor which measures the surface pressure of a single particle film. In addition, a substrate was soaked in a substratum water of a water tank as in example 1.

After that, a single particle film was formed by volatilizing Chloroform which is a solvent of the dispersed fluid with inducing particles to be closest packed in two dimensions by irradiation of an ultrasonic wave (15 W output, 80 kHz frequency) for 20 minutes in the substratum water.

Then, the single particle film was transcribed to one surface of a substrate by compressing the single particle film to diffusion pressure of 18 mNm$^{-1}$ with a movable barrier, and pulling the four-inch silicon wafer at a speed of 5 mm/minutes.

Next, an extra hydrolyzed solution was removed by a spin coater (3000 rpm) for one minute after letting the hydrolysis liquid of tetra ethoxysilane of 0.5% by mass as a binder on the silicon wafer that a single particle film was formed. After that, a silicon substrate with a single particle film etching mask having colloidal silica was obtained by letting the binder react with the heated substrate at 100 degree Celsius for 10 minutes.

Other than a scanning range of an atomic force microscope was 4.1 µm×4.1 µm, the pitch B was obtained using the same method as used in example 1 and the misalignment D of the array of the formed single particle film etching mask was also obtained. In addition, a primary peak area (a relative value) in a profile of an FFT image was obtained. The result is shown in Table 1.

In addition, gas phase etching was performed to a substrate having a single particle film etching mask using a mixed gas of Ar and CHF$_3$ at a rate of 50:50 to 75:25, and a micro structure body in which conically-shaped micro projections were formed on one side of the substrate was obtained. In addition, the same etching condition was used as in example 1.

The average height h of a conically-shaped micro projection measured as in example 1 was 208 nm, and the average pitch C of a conically-shaped micro projection measured as in example 1 (average diameter d of circular bottom) was 121.5 nm. The aspect ratio calculated was 1.7.

Then, a misalignment D' of the array of the conically-shaped micro projections calculated by equation (2) for this micro structure was 2.5%.

Figure 10:
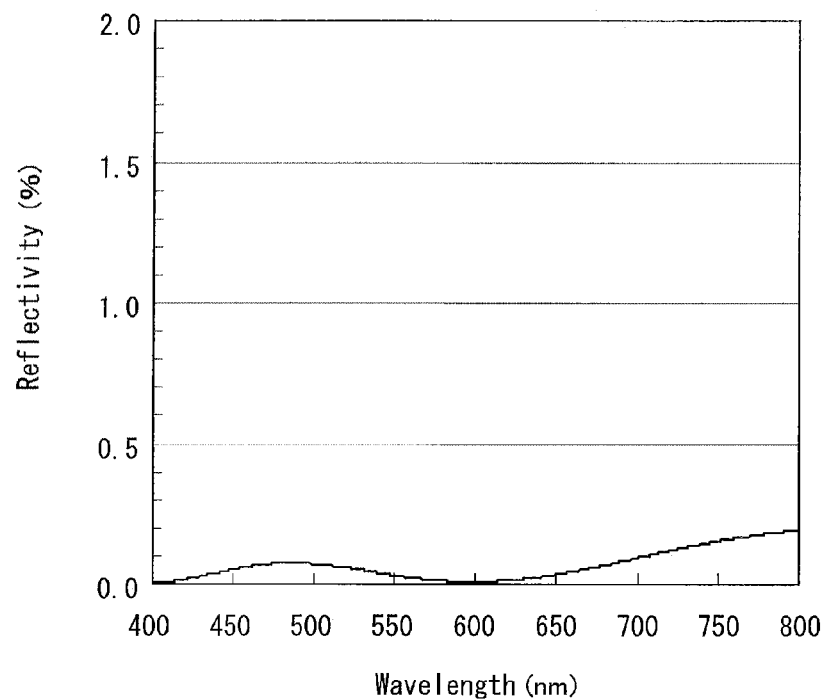
FIG. 10 is a graph representing the results of measuring visible light reflectance by a vertical incidence in a micro structure obtained in example 2.

In addition, in the micro structure, the results that determined the visible light reflectance by vertical incidence are represented in FIG. 10.

Example 3

Dispersed moisture (dispersed fluid) of 5.0% by mass of spherical colloidal silica with an average particle diameter is 298.2 nm and the variation coefficient of particle diameter is 6.7%, was prepared. In addition, the variation coefficient of the spherical colloidal silica diameter and an average particle diameter of the spherical colloidal silica was calculated from the peak which was obtained from Gaussian curve fitted with the particle size distribution based on particle dynamic light scattering method.

Then, the dispersed fluid is filtered in a membrane filter with an aperture 1.2 μmϕ, and a 1.0% by mass hydrolyzate water solution of phenyltriethoxysilane is added to the dispersed fluid which passed through the membrane filter. The solution was reacted at approximately 40 degrees Celsius for 3 hours. The dispersed fluid and a hydrolysis water solution were mixed so that the mass of phenyltriethoxysilane became 0.02 times mass of a colloidal silica particle.

A methyl ethyl ketone of the volume of 4 times of the volume of the dispersion liquid was added to the dispersed fluid which has completed the previous reaction, and stirred well. Then, hydrophobing colloidal silica was extracted by oil phase extraction.

A 0.91% by mass of hydrophobing colloidal silica dispersed fluid was dripped at a drip speed of 0.01 ml/second into a liquid surface (water was used as a substratum water, and the water temperature was 25 degrees Celsius) of a water tank (LB trough device) containing of a movable barrier which compressed a single particle film to the direction along the liquid surface, and a surface sensor which measures the surface pressure of a single particle film. In addition, a glass lens as a substrate (circular with a diameter of 75 mm and a thickness at the thickest portion of 10 mm and at the thinnest portion of 6.5 mm) was soaked beforehand in substantially vertical direction.

After that, a single particle film was formed by volatilizing methyl ethyl ketone which is a solvent of dispersed fluid with inducing particles to be closest packed in two dimensions by irradiation of ultrasonic wave (300 W output, 950 kHz frequency) for 10 minutes facing to the liquid surface from the substratum water.

Then, the single particle film was transcribed to one surface of a substrate by compressing the single particle film to be 25 mNm$^{-1}$ diffusion pressure by movable barrier, and pulling the four-inch silicon wafer at a speed of 5 mm/minutes.

Next, an extra hydrolyzed solution was removed by a spin coater (3000 rpm) for one minute after soaking the hydrolyzed solution of 1% by mass monomethyl trimethoxysilane as a binder on the silicon wafer that single-particle film was formed. After that, a glass substrate with a single particle film etching mask having colloidal silica was obtained by letting the binder react with the substrate which was heated at 100 degree Celsius for 10 minutes.

An average pitch B was obtained the same way as in example 1, and a misalignment D of the particle array of the formed single particle film etching mask was also obtained. In addition, a primary peak area (a relative value) in a profile of an FFT image was obtained. The results are shown in Table 1.

In addition, gas phase etching was performed to a substrate having a single particle film etching mask using a mixed gas of Ar and CHF$_3$ at a ratio of 50:50 to 75:25, and a micro structure body on which conically-shaped micro projections were formed on one side of the substrate was obtained. In addition, the same etching condition was used as the example 1.

The average height h of a conically-shaped micro projection measured as in example 1 was 325 nm, and the average pitch C of a conically-shaped micro projection measured as in example 1 (average diameter d of circular bottom) was 302.0 nm. The aspect ratio calculated was 1.1.

Then, a misalignment D' of the array of the conically-shaped micro projections calculated by equation (2) for this micro structure was 1.3%.

Comparative Example 1

Particulate Adsorption Method

Dispersed moisture (dispersed fluid) of 2.5% by mass of spherical colloidal silica with the same variation coefficient and the same average particle diameter as in example 1 was prepared.

Then, the dispersed fluid is filtered in a membrane filter with an aperture of 1.2 μmϕ as in example 1, and 3.5% by mass of a hydrolyzate water solution of 2-(3,4-epoxycyclohexyl)ethyl trimethoxysilane was added to the dispersed fluid which passed through the membrane filter. The solution was reacted at approximately 30 degrees Celsius for 24 hours, and the surface of a colloidal particle was modified (dispersed fluid (1)).

On the other hand, a silane coupling agent was reacted with a substrate surface by heating at 80 degrees Celsius for 20 minutes, after a 1.0% by mass hydrolyzate water solution of 3-aminopropyltriethoxysilane was spin coated for 2000 rpm on a glass substrate of 3 cm×4 cm.

Then, the dispersed fluid (1) was dripped on a glass substrate after reaction at a drip speed of 0.01 ml/second. It was spin coated for 2000 rpm and dried so that a particle was arranged in a substrate surface.

Then, the substrate on which particles appeared in the substrate surface was heated at 120 degrees Celsius for 12 hours, and the particles of the first layer of the substrate surface was selectively reacted with the substrate. Extra particles of the second layer and the higher were removed by ultrasonic cleaning equipment, and a silicon substrate with a single particle film etching mask made up of colloidal silica was obtained.

An average pitch B was obtained as in example 1, and a misalignment D of the particle array of the formed single particle film etching mask was also obtained. In addition, a primary peak area (a relative value) in a profile of an FFT image was obtained. The results are shown in Table 1.

Figure 11:
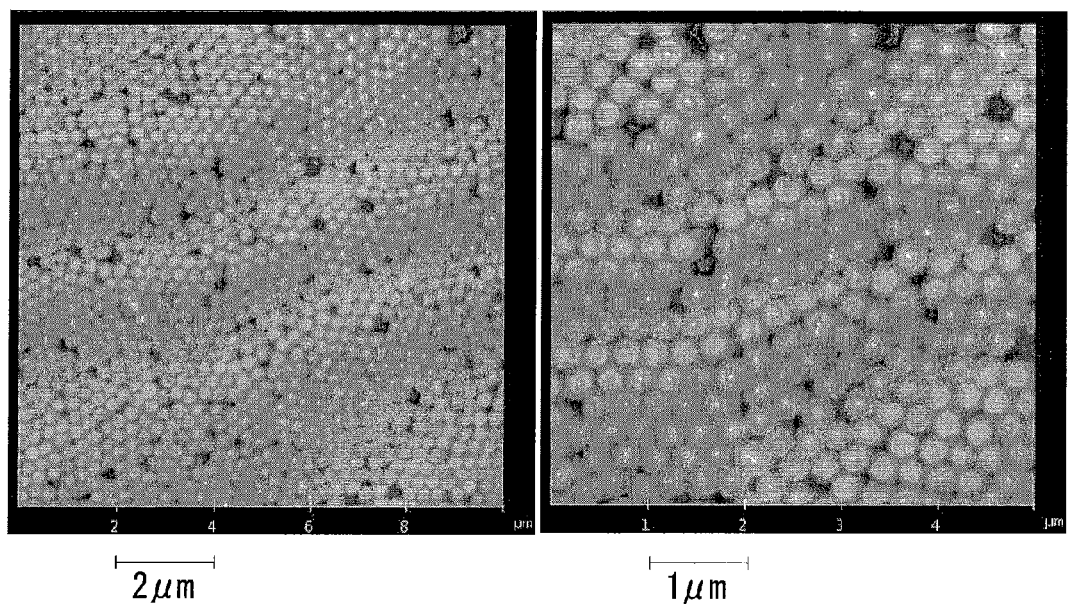
FIG. 11 is a microscopic image of an atomic force of a single particle film etching mask of comparative example 1.
Figure 12:
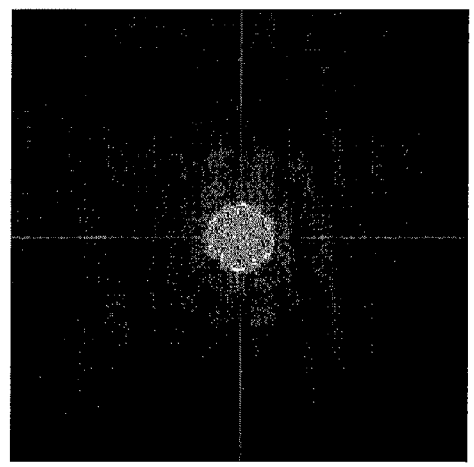
FIG. 12 is a FFT image obtained by performing a waveform separation by Fourier transformation which the microscopic image of the atomic force in FIG. 4.
Figure 13:
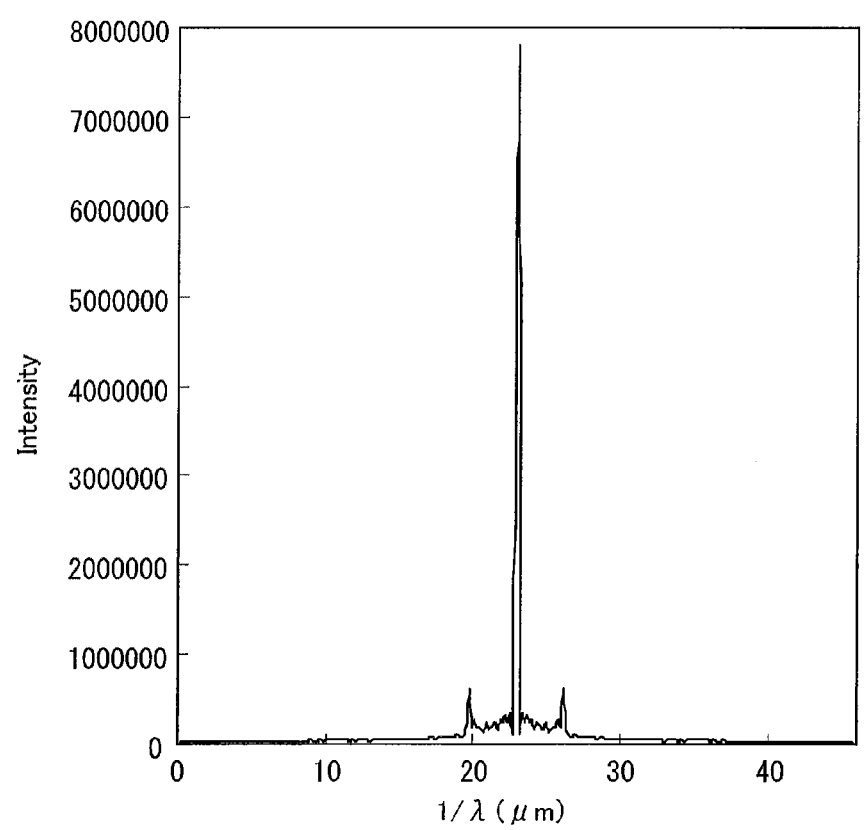
FIG. 13 is a graph showing a profile of an FFT image of FIG. 12.

In addition, FIG. 11 is the atomic force microscope image of the single particle film etching mask which particles aligned highly precisely was selected, and it is shown at two different magnifications. In addition, FIG. 12 shows an FFT image and FIG. 13 shows a profile of the FFT image.

In addition, gas phase etching was performed in a substrate with single particle film etching mask as in example 1, and a micro structure body on which conically-shaped micro projections were formed on one side of the substrate was obtained.

The average height h of a conically-shaped micro projection measured as in example 1 was 395 nm, and the average pitch C of the conically-shaped micro projections (average diameter d of circular bottom) was 363.2 nm. The aspect ratio calculated was 1.1.

Then, a misalignment D' of the array of the conically-shaped micro projections calculated by equation (2) for this micro structure was 21.8%.

Figure 14:
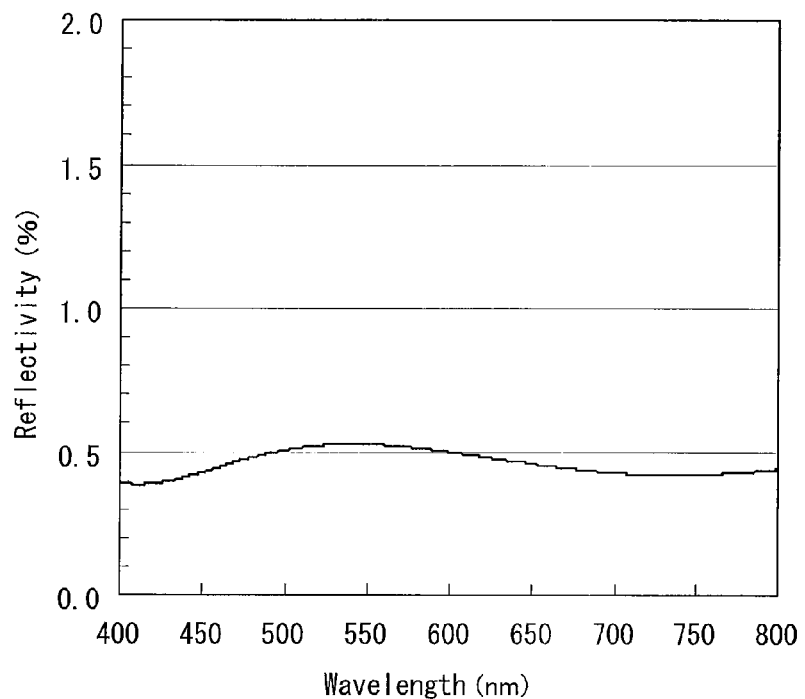
FIG. 14 is a graph showing the results of measuring visible light reflectance by a vertical incidence in a micro structure obtained in comparative example 1.

Even more, in the micro structure, the results that determined visible light reflectance by a vertical incidence is represented in FIG. 14.

Comparative Example 2

Liquid Microfilm Method

Dispersed moisture (dispersed fluid) of spherical colloidal silica which has the same average particle diameter and the same variation coefficient of particle diameter in example 2 was prepared, and the dispersed fluid was filtered in a membrane filter with aperture of 1.21 mϕ as in example 2. Then, the dispersed fluid was poured between a pair of parallel plates (area 2 cm×2 cm) which displaced in substantially horizontal direction so that the dispersed fluid makes the gap (interval) of the plates to be about 1 mm, after having adjusted a concentration of colloidal silica in 7% by mass. In addition, the upper part of the plate (made by glass) was moved in parallel by 5 to 50 mm per minute, and a single particle film was formed on the lower part of the plate (Silicon wafer). In addition, a silicon wafer was warmed to about 60 degrees Celsius with a heater, the outside ambient air (experimental environment) was set to 23 degrees Celsius, and the humidity was set to be 50% of constant temperature and humidity.

Next, extra hydrolyzed solution was removed by a spin coater (3000 rpm) for one minute after soaking the hydrolyzed solution of 1% by mass monomethyl trimethoxysilane as a binder on the silicon wafer on which a single-particle film is formed. After that, a silicon substrate with a single particle film etching mask having colloidal silica was obtained by letting the binder react with the substrate which is heated at 100 degree Celsius for 10 minutes.

An average pitch B was obtained by the same measurement used in example 2, and a misalignment D of the particle array was also obtained about the formed single particle film etching mask. In addition, a primary peak area (a relative value) in a profile of an FFT image was obtained. The results are shown in Table 1.

In addition, gas phase etching was performed in a substrate with a single particle film etching mask in the same way as example 1 and a micro structure body on which conically-shaped micro projections was formed on one side of the substrate was obtained.

The average height h of conically-shaped micro projection obtained in the same way as example 2 was 259 nm, and the average pitch C (the average diameter d of circular bottom) of the conically-shaped micro projections was 169.9 nm. The aspect ratio calculated was 1.5.

Then, a misalignment D' of the array of the conically-shaped micro projections calculated by equation (2) for this micro structure was 43.4%.

Figure 15:
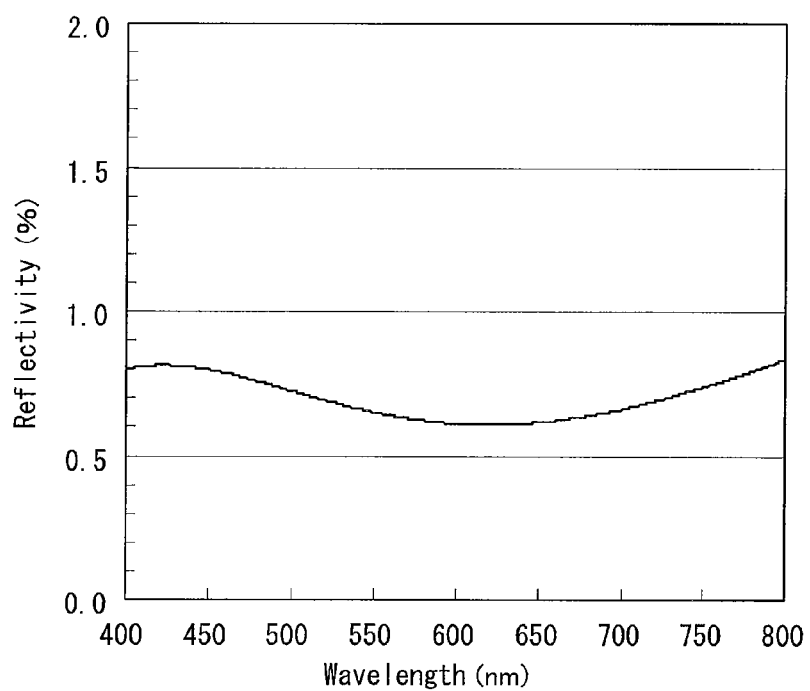
FIG. 15 is a graph showing the results of measuring visible light reflectance by a vertical incidence in a micro structure obtained in comparative example 2.

In addition, in the micro structure, the results which determined the visible light reflectance by a vertical incidence are shown in FIG. 15.

Comparative Example 3

Wet Method

A hard coat layer (about 3 μm thickness) of acrylic hardening resin was formed on one surface of optics grade PET film (188 μm thickness) using a spin coating method, and, the hard coat layer was coated with a fluorinated resin layer (about 100 nm thickness). Then, a laminate film was obtained by conducting a backside treatment (deaerated after applying a black color adhesive tape) on the other side of optic grade PET film.

Figure 16:
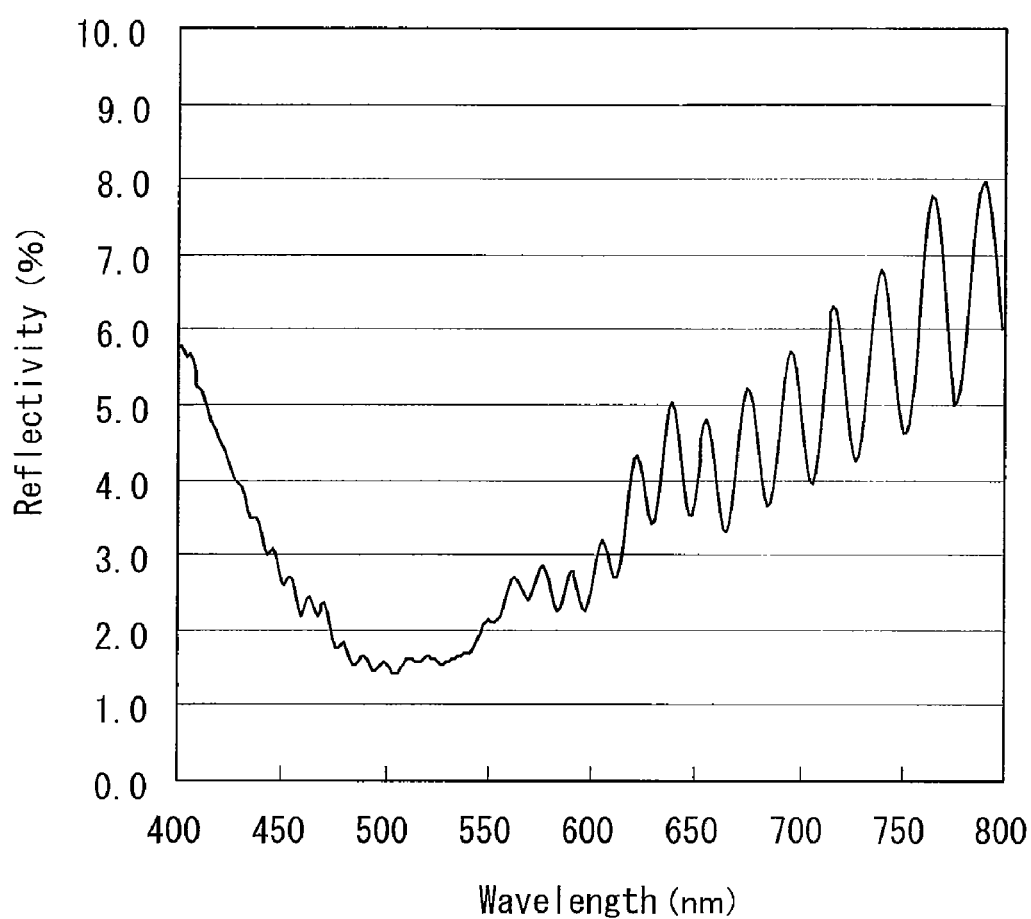
FIG. 16 is a graph showing the results of measuring visible light reflectance by a vertical incidence in a laminate film obtained in comparative example 3.

In the fluorinated resin layer of the laminate film, the results that measured visible light reflectance by vertical incidence are shown in FIG. 16.

TABLE 1

| | Substrate | Example 1 | Example 2 | Example 3 | Comparative Example 1 | Comparative Example 2 |
| --- | --- | --- | --- | --- | --- | --- |
| | | Silicon Wafer | | Glass lense | Silicon Wafer | |
| Single particle film etching mask | Average diameter A of particle (nm) | 298.2 | 118.5 | 298.2 | 298.2 | 118.5 |
| | Variation coefficient of particle diameter (%) | 6.7 | 4.2 | 6.7 | 6.7 | 4.2 |
| | Distance from zero peak to primary peak in FTT image profile (1/μm) | 3.3755 | 8.2331 | 3.3755 | 2.753 | 5.886 |
| | Average pitch B (nm) | 296.3 | 121.5 | 302.0 | 363.2 | 169.9 |
| | Misalignment D of array (%) | 0.7 | 2.5 | 1.3 | 21.8 | 43.4 |
| | Primary peak area (−) | 1354446 | 1402996 | 1335140 | 287703 | 216010 |
| Micro structure | Average height h of conically-shaped micro projection (nm) | 330 | 208 | 325 | 395 | 259 |
| | Average pitch C of array of conically-shaped micro projection (nm) | 296.3 | 121.5 | 302.0 | 363.2 | 169.9 |
| | Aspect ratio of conically-shaped micro projection (−) | 1.1 | 1.7 | 1.1 | 1.1 | 1.5 |
| | Misalignment D' of conically-shaped micro projection (%) | 0.7 | 2.5 | 1.3 | 21.8 | 43.4 |

From the above results, a single particle film etching mask less than or equal to 10% misalignment D of particle array which defined in equation (1) was obtained according to the example 1 and 2. Also, reflectivity in the whole visible light area is less than or equal to 0.2% which is very small (FIGS. 9 and 10) by using these single particle film etching mask. Furthermore, a micro structure having better antireflection effect compared to a film by conventional dry method (AR film) was able to be produced. In addition, according to the examples, area of a primary peak in a profile of FFT image in the example 1 was 4.7 times of that of the comparative example 1, and area of a primary peak in a profile of FFT image in the example 2 was 6.5 times of that of the comparative example 2. This suggests that the various pitches between the particles were restrained.

In contrast, a misalignment D of an array in a single particle film etching mask obtained from the comparative example 1 (particulate adsorption step), comparative example 2 (liquid microfilm method) was respectively 21.8% and 43.4% which was quite big. In addition, reflectivity of visible light of the micro structure obtained with use of these single particles etching mask was bigger than those of the example 1 and 2.

From these results, a micro structure obtained with the use of these single particles etching mask was produced by the drip step, the single particle formation step and the transcription step of the present invention. According to the single particle film etching mask which the misalignment D of the array is less than or equal to 10%, a micro structure which preferred as an antireflection can be produced relatively easily compared to a single particle film etching mask formed by a particle absorption method or a liquid microfilm method.

In addition, a laminated film of the comparative example 3 (wet method) differs from each example or comparative example 1 and 2 in the principle that a reflection prevention effect develops. Wavelength dependence of reflectivity in a laminated film of the comparative example 3 is big because the antireflection effect is obtained by interference to shift a phase of incident light and a reflected light by half. Antireflection effect was unable to be obtained in the whole visible light area.

INDUSTRIAL APPLICABILITY

According to the present invention, a single particle film etching mask on which each particle is precisely aligned and closest packed in two dimensions, a single particle film etching mask production method which produces the single particle film etching mask, a micro structure production method which uses the single particle film produced by the single particle film production method, and a highly precise micro structure obtained by the micro structure production method can be provided. In addition, a nano imprint mold with use of a micro structure, a nano imprint device which possesses the nano imprint mold, and a highly precise nano imprint product obtained by the device are provided.

The invention claimed is:

1. A method of producing a single particle film etching mask comprising:
a drip step in which a dispersed liquid in which particles dispersed in a solvent are dripped onto a liquid surface of a water tank;
a single particle film formation step in which an ultrasonic sound irradiates from a substratum water of the water tank to the liquid surface of the water tank, and a single particle film including particles obtained by volatizing the solvent is formed; and
a transcription step in which the single particle film is transcribed to a substrate,
wherein an ultrasonic frequency of the ultrasonic sound is 700 kHz to 2 MHz.

2. A method of producing a micro structure comprising:
a drip step in which a dispersed liquid in which particles dispersed in a solvent are dripped onto a liquid surface of a water tank;
a single particle film formation step in which an ultrasonic sound irradiates from a substratum water of the water tank to the liquid surface of the water tank, and a single particle film including of particles obtained by volatizing the solvent is formed;
a transcription step in which the single particle film is transcribed to a substrate; and
an etching step in which the substrate is etched with gasphase etching using the single particle film as an etching mask,
wherein an ultrasonic frequency of the ultrasonic sound is 700 kHz to 2 MHz.

* * * * *